(12) United States Patent
Li et al.

(10) Patent No.: US 9,093,149 B2
(45) Date of Patent: Jul. 28, 2015

(54) LOW COST PROGRAMMABLE MULTI-STATE DEVICE

(75) Inventors: Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 13/602,666

(22) Filed: Sep. 4, 2012

(65) Prior Publication Data

US 2014/0063895 A1    Mar. 6, 2014

(51) Int. Cl.
| | | |
|---|---|---|
| G11C 7/00 | (2006.01) | |
| G11C 17/02 | (2006.01) | |
| G11C 17/00 | (2006.01) | |
| H01L 27/22 | (2006.01) | |
| H01L 23/525 | (2006.01) | |
| H01L 43/08 | (2006.01) | |
| H01L 43/12 | (2006.01) | |
| G11C 11/56 | (2006.01) | |

(Continued)

(52) U.S. Cl.
CPC ............ *G11C 17/02* (2013.01); *G11C 11/5607* (2013.01); *G11C 11/5692* (2013.01); *G11C 17/00* (2013.01); *G11C 17/14* (2013.01); *G11C 17/16* (2013.01); *G11C 17/165* (2013.01); *H01L 23/5252* (2013.01); *H01L 23/5256* (2013.01); *H01L 27/22* (2013.01); *H01L 27/224* (2013.01); *H01L 43/08* (2013.01); *H01L 43/12* (2013.01)

(58) Field of Classification Search
CPC  G11C 17/02; H01L 23/5252; H01L 23/5256; H01L 27/222

USPC ................... 365/96, 97, 171, 173, 225.7, 188
See application file for complete search history.

(56) References Cited

U.S. PATENT DOCUMENTS 5,412,593 A    5/1995  Magel et al.
6,473,337 B1 *  10/2002  Tran et al. ..................... 365/173

(Continued)

FOREIGN PATENT DOCUMENTS

| EP | 1293988 A2 | 3/2003 |
|---|---|---|
| WO | 2011031551 A1 | 3/2011 |
| WO | 2014031444 A1 | 2/2014 |

OTHER PUBLICATIONS

Analog Devices, "256-Position, Two-Time Programmable, I2C Digital Potentiometer", AD5170, Rev.G, pp. 1-24.

(Continued)

*Primary Examiner* — Viet Q Nguyen
(74) *Attorney, Agent, or Firm* — Sam Talpalatsky; Nicholas J. Pauley; Paul Holdaway

(57) ABSTRACT

A one time programmable (OPT) and multiple time programmable (MTP) structure is constructed in a back end of line (BEOL) process using only one, two or three masks. The OTP/MTP structure can be programmed in one of three states, a pre-programmed high resistance state, and a programmable low resistance state and a programmable very high resistance state. In the programmable low resistance state, a barrier layer is broken down during an anti-fuse programming so that the OTP/MTP structure exhibits resistance in the hundred ohm order of magnitude. In the very high resistance state a conductive fuse is blown open during programming so that the OTP/MTP structure exhibits resistance in the mega-ohm order of magnitude. The OTP/MTP structure may include a magnetic tunnel junction (MTJ) structure or a metal-insulator-metal (MIM) capacitor structure.

17 Claims, 17 Drawing Sheets

(51) Int. Cl.
*G11C 17/14* (2006.01)
*G11C 17/16* (2006.01)

(56) References Cited

U.S. PATENT DOCUMENTS

| | | | |
|---|---|---|---|
| 6,483,734 B1 | 11/2002 | Sharma et al. | |
| 6,518,588 B1 * | 2/2003 | Parkin et al. | 257/3 |
| 6,768,150 B1 * | 7/2004 | Low et al. | 257/295 |
| 6,977,181 B1 * | 12/2005 | Raberg | 438/3 |
| 7,265,404 B2 * | 9/2007 | Cao et al. | 257/295 |
| 7,382,647 B1 * | 6/2008 | Gopalakrishnan | 365/163 |
| 7,554,543 B2 * | 6/2009 | Aguera | 345/428 |
| 7,572,682 B2 * | 8/2009 | Yang et al. | 438/131 |
| 7,660,180 B2 * | 2/2010 | Boeve et al. | 365/225.7 |
| 7,732,881 B2 * | 6/2010 | Wang | 257/421 |
| 8,051,240 B2 | 11/2011 | Dutta et al. | |
| 8,101,471 B2 | 1/2012 | Hafez et al. | |
| 8,299,567 B2 * | 10/2012 | Wang et al. | 257/529 |
| 8,421,186 B2 * | 4/2013 | Li et al. | 257/529 |
| 8,482,966 B2 * | 7/2013 | Kang et al. | 365/158 |
| 8,492,808 B2 * | 7/2013 | Omori et al. | 257/295 |
| 8,492,858 B2 * | 7/2013 | Li et al. | 257/421 |
| 8,507,326 B2 * | 8/2013 | Kurz et al. | 438/131 |
| 8,535,952 B2 * | 9/2013 | Ranjan et al. | 438/3 |
| 8,564,079 B2 * | 10/2013 | Kang et al. | 257/421 |
| 8,736,020 B2 * | 5/2014 | Bao et al. | 257/530 |
| 8,836,124 B2 * | 9/2014 | Bonilla et al. | 257/751 |
| 2003/0179601 A1 * | 9/2003 | Seyyedy et al. | 365/158 |
| 2004/0184315 A1 | 9/2004 | Hidaka | |
| 2005/0232039 A1 | 10/2005 | Hsu | |
| 2006/0291315 A1 | 12/2006 | Andre et al. | |
| 2008/0170432 A1 * | 7/2008 | Asao | 365/171 |
| 2010/0067293 A1 * | 3/2010 | Yu et al. | 365/171 |
| 2011/0163455 A1 * | 7/2011 | Gaidis | 257/773 |

OTHER PUBLICATIONS

International Search Report and Written Opinion—PCT/US2013/058075—ISA/EPO—Dec. 4, 2013.

* cited by examiner

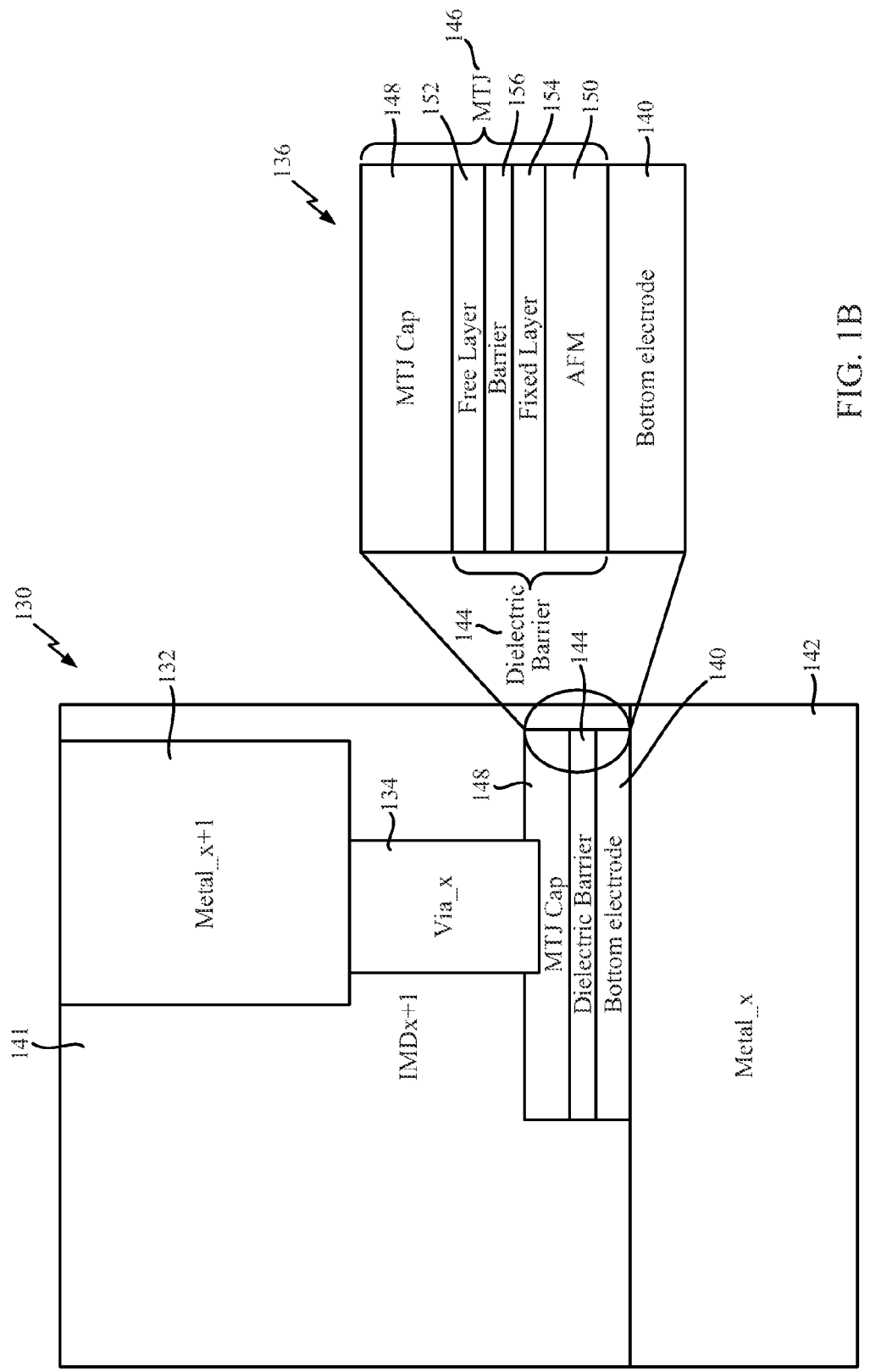

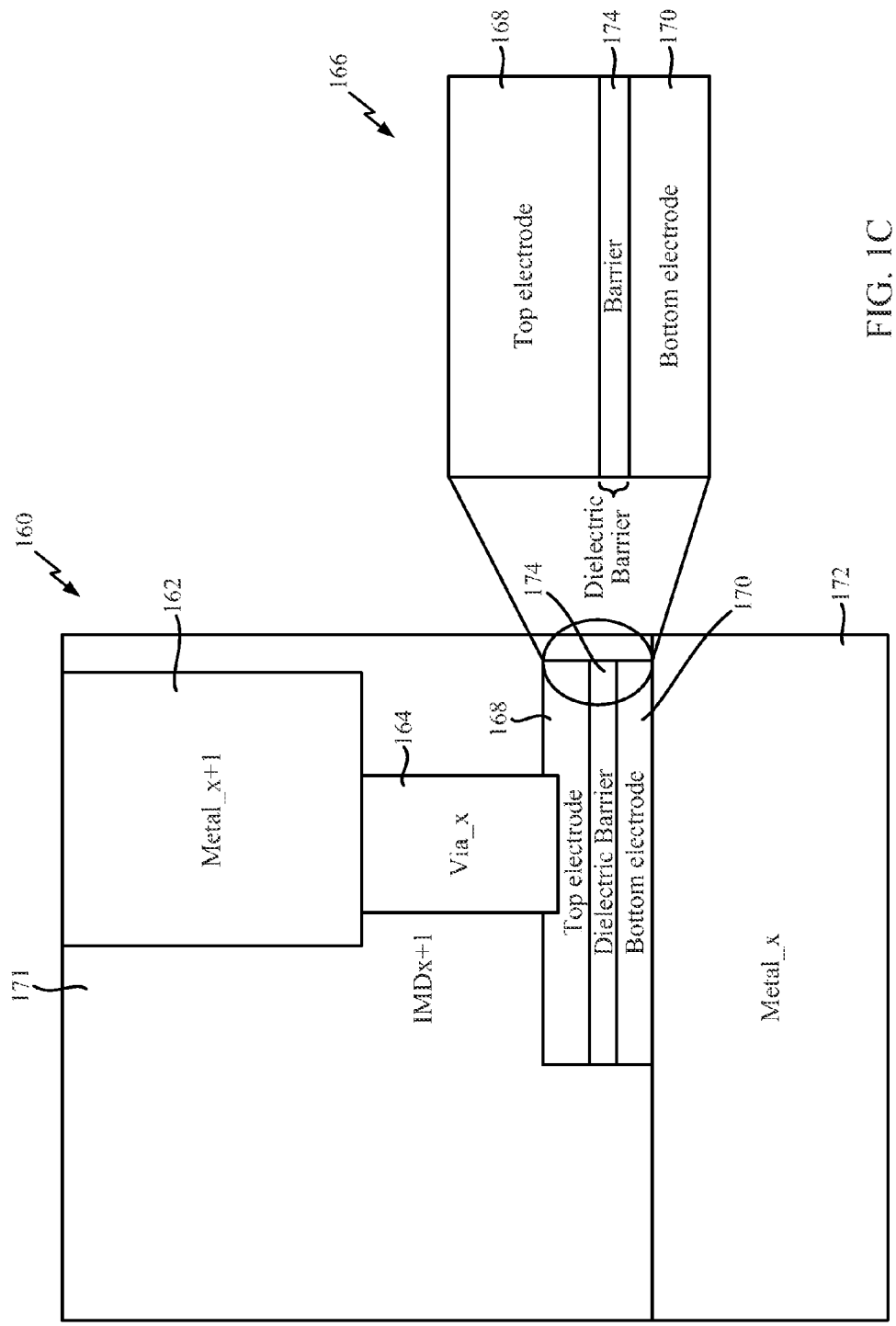

LOW COST PROGRAMMABLE MULTI-STATE DEVICE

TECHNICAL FIELD

The present disclosure generally relates to one time programmable (OTP) and multiple time programmable (MTP) structures. More specifically, the present disclosure relates to forming OTP and multiple time programmable (MTP) structures with logic back end of line (BEOL) process flow.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such structure having a fixed layer, a tunneling layer, and a free layer is a magnetic tunnel junction (MTJ). An MTJ normally also includes top and bottom electrode and may be formed with or without an antiferromagnetic layer to pin the fixed layer. The electrical resistance of an MTJ depends on whether the free layer magnetization and fixed layer magnetization are parallel or anti-parallel with each other. A memory structure such as Spin-Transfer Torque (STT) MRAM is built from an array of individually addressable MTJs.

To write data in STT MRAM, a write current with a specific direction of write "1" or "0", which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In STT MRAM, two distinct states are defined by two different resistances of an MTJ in a bitcell of the MRAM. The two different resistances represent a logic "0" and a logic "1" value stored by the MTJ.

SUMMARY

An aspect of the present disclosure include a back end of line (BEOL) structure, including a first conductive element of a first conductive layer, a first via coupled to the first conductive element; and a programmable structure coupled to the first via. The programmable structure includes a dielectric barrier and a bottom electrode.

Another aspect of the present disclosure includes a method of programming a one time programmable (OTP) or multiple time programmable (MTP) back end of line (BEOL) structure. The method includes applying a predetermined voltage to a dielectric barrier layer of the BEOL structure. The predetermined voltage is sufficient to break down the dielectric barrier layer.

Another aspect of the present disclosure includes an apparatus for programming a one time programmable (OTP) or multiple time programmable (MTP) back end of line (BEOL) structure. The apparatus includes means for applying a predetermined voltage to a dielectric barrier layer of the BEOL structure. The predetermined voltage is sufficient to break down the dielectric barrier layer. The apparatus also includes means for applying the predetermined voltage to a magnetic tunnel junction (MTJ) structure including the dielectric barrier layer or to a metal-insulator-metal (MIM) capacitor structure including the dielectric barrier layer.

Another aspect of the present disclosure includes a method of programming a one time programmable (OTP) or multiple time programmable (MTP) back end of line (BEOL) structure including a step of applying a predetermined voltage to a dielectric barrier layer of the BEOL structure. The predetermined voltage is sufficient to break down the dielectric barrier layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered, in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 1A-1C are cross-sectional diagrams of a one time programmable (OTP) structure according to aspects of the present disclosure.

DETAILED DESCRIPTION

Figure 1A:
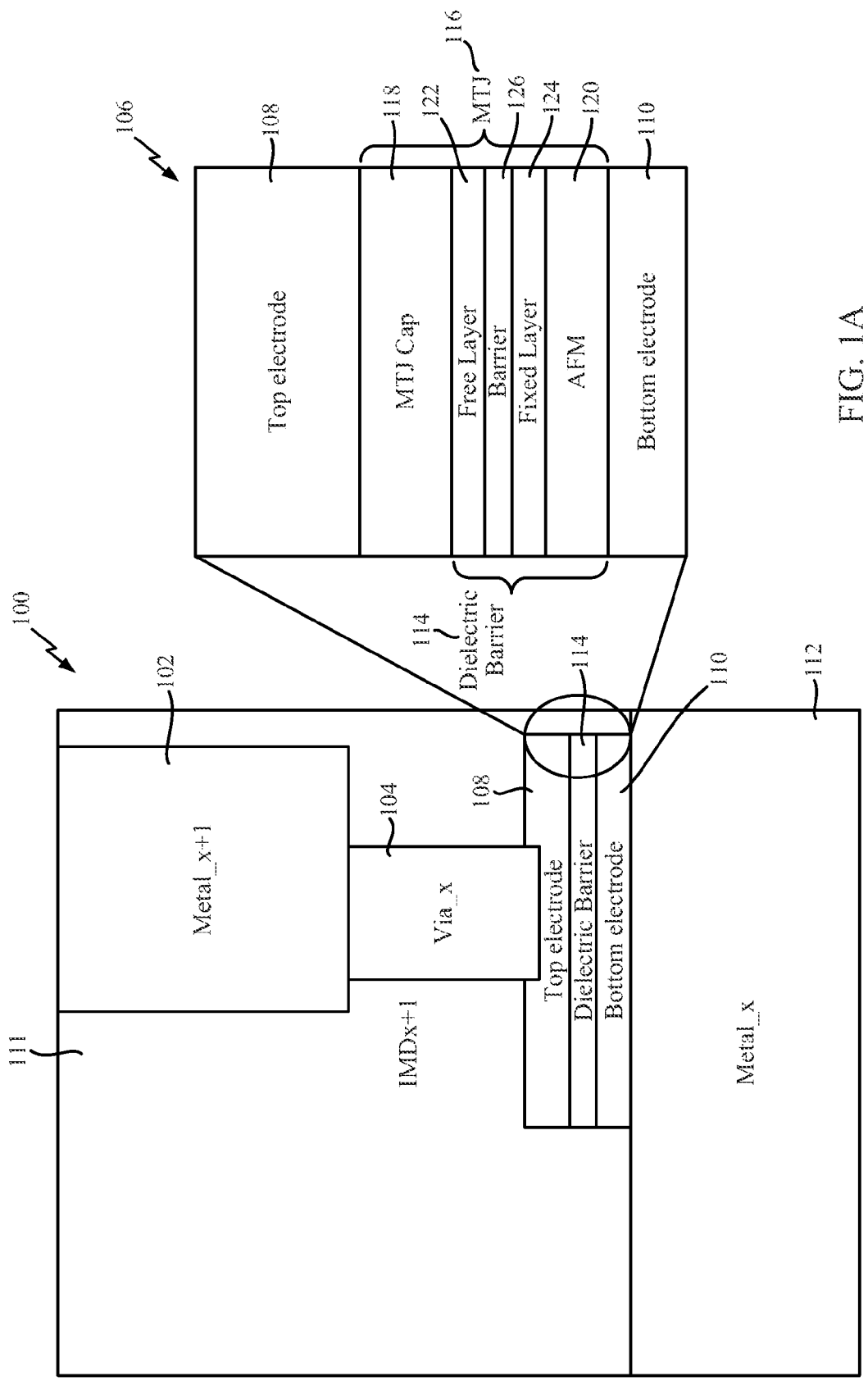

Aspects of the present disclosure include a low cost one time programmable (OPT) structure. Depending on structure and process, one to three masks can be used to construct a low cost OPT structure in a back end of line (BEOL) process. According to one aspect of the present disclosure, the low cost OTP structure has two states, a pre-programmed high resistance state, and a programmable low resistance state. In the pre-programmed high resistance state the OTP structure exhibits resistance in the kilo-ohm order of magnitude. In the programmable low resistance state a barrier layer is broken down during an anti-fuse programming so that the OTP structure exhibits resistance in the hundred ohm order of magnitude.

Another aspect of the disclosure includes a low cost OTP/(multiple time programmable) MTP structure. Depending on structure and process, two to three masks can be used to construct the low cost OTP/MTP structure in a BEOL process. According to one aspect of the present disclosure, the low cost OTP/MTP structure has three states, a pre-programmed high resistance state, a programmable low resistance state, and a programmable very high resistance state. In the pre-programmable high resistance state the OTP structure exhibits resistance in the kilo-ohm order of magnitude. In the programmable low resistance state a barrier layer is broken down during an anti-fuse programming so that the OTP structure exhibits resistance in the hundred ohm order of magnitude. In the very high resistance state a conductive fuse is blown open during programming so that the OTP structure exhibits resistance in the mega-ohm order of magnitude.

According to aspects of the present disclosure the OTP programming voltage is tunable by adjusting a dielectric barrier thickness. The dielectric barrier can be a magnetic tunnel junction (MTJ) structure or MTJ metal oxide barrier or other dielectric film barrier. The OTP programming voltage can be from ~0.5V to 10V depending on barrier thickness.

According to aspects of the present disclosure, top and bottom electrodes can be a common barrier metal or other conductor material that is common to semiconductor processing. Although the figures describe "metal," it should be appreciated that any conductive material could substitute for the metal. The various aspects of the disclosure are compatible with a logic back end of line (BEOL) process flow and may be manufactured with BEOL processes at low cost.

A back end of line (BEOL) structure 100, according to one aspect of the present disclosure, is described with reference to FIG. 1A. The BEOL structure 100 includes a first conductive element 102 of a first conductive layer formed in a first inter-metal dielectric (IMD) layer 111, and a first via 104 coupled to the first conductive element 102. A one time programmable (OTP) structure 106 is coupled to the first via 104. According to one aspect of the present disclosure, the OTP structure 106 includes a top electrode 108 coupled to the first via 104 and a bottom electrode 110 coupled to a second conductive layer 112. A dielectric barrier 114 is coupled between the top electrode 108 and the bottom electrode 110. According to this aspect of the disclosure, the dielectric barrier 114 of the BEOL structure 100 is a magnetic tunnel junction (MTJ) 116. The MTJ 116 includes a MTJ cap 118 coupled to the top electrode 108 and an anti-ferromagnetic layer 120 coupled to the bottom electrode 110. A free layer 122 of the MTJ is coupled to the MTJ cap 118, and a fixed layer 124 of the MTJ is coupled to the AFM layer 120. A dielectric film layer 126 of the MTJ is coupled between the free layer 122 and the fixed layer 124.

Alternatively, according to this aspect of the disclosure, the MTJ 116 can have a reversed film stack (not shown) in which the anti-ferromagnetic film 120 is on top of the film stack to couple with the top electrode 108. In this alternative configuration, the fixed layer 124 couples to the anti-ferromagnetic film 120 and to the barrier 126. The barrier 126 couples to free layer 122, and the free layer 122 couples to MTJ cap 118. The MTJ cap 118 couples to bottom electrode 110.

In another alternative configuration, the MTJ 116 can be a perpendicular MTJ in which the MTJ film stack (not shown) can be a fixed layer 124 coupled to the bottom electrode 110, a free layer 122 coupled to the MTJ cap 118, and the tunnel barrier layer 126 coupled between the free layer 122 and the fixed layer 124.

According to the aspect of the disclosure shown in FIG. 1A, the OTP structure 106 is fabricated using a single mask in a BEOL process. The OTP structure 106 has high resistance in a pre-programmed state and low resistance in a programmed state after the dielectric barrier 114 is broken down during programming. The program voltage depends on the thickness of the tunnel barrier layer 126.

Another back end of line (BEOL) structure 130, according to one aspect of the present disclosure, is described with reference to FIG. 1B. The BEOL structure 130 includes a first conductive element 132 of a first conductive layer formed in a first inter-metal dielectric (IMD) layer 141, and a first via 134 coupled to the first conductive element 132. A one time programmable (OTP) structure 136 is coupled to the first via 134. According to one aspect of the present disclosure, the OTP structure 136 includes MTJ cap 148 coupled to the first via 134 and a bottom electrode 140 coupled to a second conductive layer 142. A dielectric barrier 144 is coupled between first via 134 and the bottom electrode 140. An MTJ 146 includes the MTJ cap 148 and an anti-ferromagnetic layer 150 coupled to the bottom electrode 140. A free layer 152 of an MTJ is coupled to the MTJ cap 148, and a fixed layer 154 of the MTJ is coupled to the AFM layer 150. A dielectric film layer 156 of the MTJ is coupled between the free layer 152 and the fixed layer 154. The dielectric barrier 144 of the BEOL structure 130 includes the free layer 152, the dielectric barrier layer 156, the fixed layer 154 and the AFM layer 150 of the MTJ 146.

Alternatively, according to this aspect of the disclosure, the MTJ 146 can have a reversed film stack (not shown) in which the anti-ferromagnetic film 150 is on top of the film stack to couple with the via 134. In this alternative configuration, the fixed layer 154 couples to the anti-ferromagnetic film 150 and the barrier 156. The barrier 156 couples to the free layer 152, the free layer 152 couples to the MTJ cap 148, and the MTJ cap 148 couples to the bottom electrode 140.

In another alternative configuration, the MTJ 146 can be a perpendicular MTJ in which the MTJ film stack (not shown) can be a fixed layer 154 coupled to the bottom electrode 140, a free layer 152 coupled to the MTJ cap 148, and a tunnel barrier layer 156 coupled between the free layer 152 and the fixed layer 154.

According to the aspect of the disclosure shown in FIG. 1B, the OTP structure 136 is fabricated using a single mask in a BEOL process. The OTP structure 136 has resistance in a pre-programmed state and low resistance in a programmed state after the dielectric barrier 144 is broken down during programming. The program voltage depends on the thickness of the dielectric barrier layer 156.

A back end of line (BEOL) structure 160 according to another aspect of the present disclosure is described with reference to FIG. 1C. The BEOL structure 160 includes a first conductive element 162 of a first conductive layer formed in a first inter-metal dielectric (IMD) layer 171, and a first via 164 coupled to the first conductive element 162. A one time programmable (OTP) structure 166 is coupled to the first via 164. According to one aspect of the present disclosure, the OTP structure 166 includes a top electrode 168 coupled the first via 164 and a bottom electrode 170 coupled to a second conductive layer 172. A dielectric barrier 174 is coupled between the top electrode 168 and the bottom electrode 170. According to this aspect of the disclosure, the dielectric barrier 174 of the BEOL structure 160 is a dielectric film layer. The dielectric barrier layer 174 can be an MTJ metal oxide barrier or other dielectric barrier, for example.

According to the aspect of the disclosure shown in FIG. 1C, the OTP structure 166 is fabricated using a single mask in a BEOL process. The OTP structure 166 has high resistance in a pre-programmed state and low resistance in a programmed state after the dielectric barrier 174 is broken down during programming. The program voltage depends on the thickness of the dielectric barrier layer 174. According to this aspect of the present disclosure, the OTP structure 166 can be a metal-insulator-metal (MIM) capacitor structure, for example.

A back end of line (BEOL) structure 200 according to another aspect of the present disclosure is described with reference to FIG. 2A. The BEOL structure 200 includes a first conductive element 202 of a first conductive layer formed in a first inter-metal dielectric (IMD) layer 211, a first via 204 coupled to the first conductive element 202, a second conductive element 203 of the first conductive layer, and a second via 205 coupled to the second conductive element 203. A first metal diffusion cap layer 201 is formed on the first conductive element 202, the second conductive element 203 and the first IMD layer 211. A one time programmable (OTP) structure 206 is coupled to the first via 204 and the second via 205. According to one aspect of the present disclosure, the OTP structure 206 includes a top electrode 208 coupled the first via 204 and a bottom electrode 210 formed on a second metal diffusion cap layer 207. The bottom electrode 210 is coupled to the second via 205. The second metal diffusion cap layer 207 is formed on a second inter-metal dielectric (IMD) layer 212. A dielectric barrier 214 is coupled between the top electrode 208 and the bottom electrode 210.

Figure 2A:
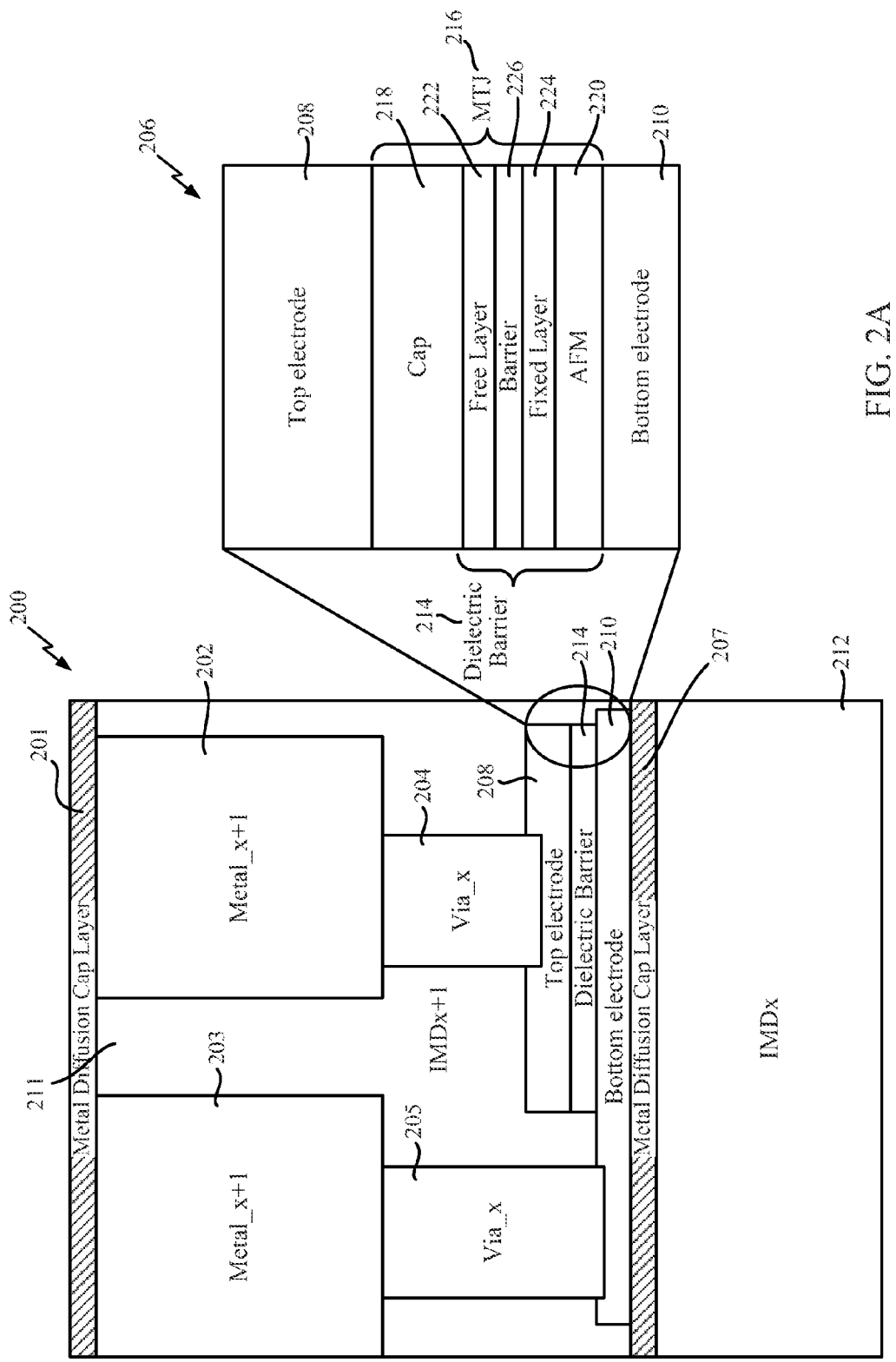
FIGS. 2A-2C are cross-sectional diagrams of a one time/multiple time programmable (OTP/MTP) structure according to aspects of the present disclosure.

According to the aspect of the disclosure shown in FIG. 2A, the dielectric barrier 214 of the BEOL structure 200 is a magnetic tunnel junction (MTJ) 216. The MTJ 216 includes an MTJ cap 218 coupled to the top electrode 208 and an anti-ferromagnetic layer 220 coupled to the bottom electrode 210. A free layer 222 of the MTJ is coupled to the MTJ cap 218, and a fixed layer 224 of the MTJ is coupled to the AFM layer 220. A dielectric barrier layer 226 of the MTJ is coupled between the free layer 222 and the fixed layer 224.

Alternatively, according to this aspect of the disclosure the MTJ 216 can have a reversed film stack (not shown) in which the anti-ferromagnetic film 220 is on top of the film stack to couple with top electrode 208. In this alternative configuration, the fixed layer 224 couples to the anti-ferromagnetic film 220 and the barrier 226. The barrier 226 couples to the free layer 222, the free layer 222 couples to the MTJ cap 218, and the MTJ cap 218 couples to the bottom electrode 210.

In another alternative configuration, the MTJ 216 can be a perpendicular MTJ. The MTJ film stack (not shown) can be a fixed layer 224 coupled to the bottom electrode 210, a free layer 222 coupled to the MTJ cap 218, and a tunnel barrier layer 226 is coupled between the free layer 222 and the fixed layer 224.

According to the aspect of the disclosure shown in FIG. 2A, the OTP structure 206 is fabricated using two masks in a BEOL process, in which a first mask is used to form the top electrode 208 and dielectric barrier 214 and a second mask is used to form the bottom electrode 210. The OTP structure 206 has high resistance in a pre-programmed state and low resistance in a programmed state after the dielectric barrier 214 is broken down during programming. The program voltage depends on the thickness of the dielectric barrier layer 226.

A back end of line (BEOL) structure 230 according to another aspect of the present disclosure is described with reference to FIG. 2B. The BEOL structure 230 includes a first conductive element 232 of a first conductive layer formed in a first inter-metal dielectric (IMD) layer 241, a first via 234 coupled to the first conductive element 232, a second conductive element 233 of the first conductive layer, and a second via 235 coupled to the second conductive element 233. A first metal diffusion cap layer 231 is formed on the first conductive element 232, the second conductive element 233 and the first IMD layer 241. A one time programmable (OTP) structure 236 is coupled to the first via 234 and the second via 235.

According to one aspect of the present disclosure, the OTP structure 236 includes an MTJ cap 238 coupled to the first via 234 and a bottom electrode 210 formed on a second metal diffusion cap layer 237. The bottom electrode 210 is coupled to the second via 235. The second metal diffusion cap layer 237 is formed on a second inter-metal dielectric (IMD) layer 242. A dielectric barrier 244 is coupled between the first via 234 and the bottom electrode 210. An MTJ 246 includes an anti-ferromagnetic layer 250 coupled to the bottom electrode 210. A free layer 252 of the MTJ 246 is coupled to the MTJ cap 238, and a fixed layer 254 of the MTJ 246 is coupled to the AFM layer 250. A dielectric barrier layer 256 of the MTJ 246 is coupled between the free layer 252 and the fixed layer 254. The dielectric barrier 244 of the BEOL structure 230 includes the free layer 252, the dielectric barrier layer 256, the fixed layer 254 and the AFM layer 250 of the MTJ 246.

Alternatively, according to this aspect of the disclosure the MTJ 246 can have reversed film stack (not shown), in which the anti-ferromagnetic film 250 is on top of the film stack to couple with via 234. In this alternative configuration, the fixed layer 254 couples to the anti-ferromagnetic film 250 and the barrier 256. The barrier 256 couples to the free layer 252, the free layer 252 couples to the MTJ cap 238, and the MTJ cap 238 couples to the bottom electrode 210.

In another alternative configuration, the MTJ 216 can be a perpendicular MTJ in which the MTJ film stack (not shown) can be a fixed layer 254 coupled to the bottom electrode 210, a free layer 252 coupled to the MTJ cap 238, and a tunnel barrier layer 256 coupled between the free layer 252 and the fixed layer 254.

According to this aspect of the present disclosure, the OTP structure 236 is fabricated using two masks in a BEOL process, in which a first mask is used to form the MTJ cap 238 and dielectric barrier 244 and a second mask is used to form the bottom electrode 210. The OTP structure 236 has high resistance in a pre-programmed state and low resistance in a programmed state after the dielectric barrier 244 is broken down during programming. The program voltage depends on the thickness of the dielectric film barrier layer 256.

A back end of line (BEOL) structure 260 according to still another aspect of the present disclosure is described with reference to FIG. 2C. The BEOL structure 260 includes a first conductive element 262 of a first conductive layer formed in a first inter-metal dielectric (IMD) layer 271, a first via 264 coupled to the first conductive element 262, a second conductive element 263 of the first conductive layer, and a second via 265 coupled to the second conductive element 263. A first metal diffusion cap layer 261 is formed on the first conductive element 262, the second conductive element 263 and the first IMD layer 271. A one time programmable (OTP) structure 266 is coupled to the first via 264 and the second via 265. According to one aspect of the present disclosure, the OTP structure 266 includes a top electrode 268 coupled the first via 264 and a bottom electrode 270 formed on a second metal diffusion cap layer 267. The bottom electrode 270 is coupled to the second via 265. The second metal diffusion cap layer 267 is formed on a second inter-metal dielectric (IMD) layer 272. A dielectric barrier 274 is coupled between the top electrode 268 and the bottom electrode 270. According to this aspect of the disclosure, the dielectric barrier 274 of the BEOL structure 260 is a metal oxide layer. The dielectric barrier layer 274 can be an MTJ metal oxide barrier or other dielectric film barrier, for example.

According to this aspect of the present disclosure, the OTP structure 266 is fabricated using two masks in a BEOL process, in which a first mask is used to form the top electrode 268 and dielectric barrier 274 and a second mask is used to form the bottom electrode 270. The OTP structure 266 has high resistance in a pre-programmed state and low resistance in a programmed state after the dielectric barrier 244 is broken down during programming. The program voltage depends on the thickness of the dielectric barrier layer or dielectric film layer 274. According to this aspect of the present disclosure, the OTP structure 266 can be a metal-insulator-metal (MIM) capacitor structure, for example.

A back end of line (BEOL) structure 300, according to another aspect of the present disclosure, is described with reference to FIG. 3A. The BEOL structure 300 includes a first conductive element 302 of a first conductive layer formed in a first inter-metal dielectric (IMD) layer 311 and a first via 304 coupled to the first conductive element 302. A first metal diffusion cap layer 301 is formed on the first conductive element 302 and the first IMD layer 311. A one time programmable (OTP) structure 306 is coupled to the first via 304. According to one aspect of the present disclosure, the OTP structure 306 includes a top electrode 308 coupled to the first via 304 and a bottom electrode 310 formed on a second metal diffusion cap layer 307. The second metal diffusion cap layer 307 is formed on a second IMD layer 312 and a second conductive element 313 of a second conductive layer. A bottom contact 315 extends through the second metal diffusion cap layer 307 and is coupled between the bottom electrode 310 and the second conductive element 313.

A dielectric barrier 314 is coupled between the top electrode 308 and the bottom electrode 310. According to the aspect of the disclosure shown in FIG. 3A, the dielectric barrier 314 of the BEOL structure 300 is a magnetic tunnel junction (MTJ) 316. The MTJ 316 includes an MTJ cap 318 coupled to the top electrode 308 and an anti-ferromagnetic layer 320 coupled to the bottom electrode 310. A free layer 322 of the MTJ 316 is coupled to the MTJ cap 318, and a fixed layer 324 of the MTJ 316 is coupled to the AFM layer 320. A dielectric barrier layer 326 of the MTJ 316 is coupled between the free layer 322 and the fixed layer 324.

Alternatively, according to this aspect of the disclosure the MTJ 316 can have reversed film stack (not shown) in which the anti-ferromagnetic film 320 is on top of the film stack to couple with the top electrode 308. In this alternative configuration, the fixed layer 324 couples to the anti-ferromagnetic film 320 and the barrier 326. The barrier 326 couples to the free layer 322, the free layer 322 couples to the MTJ cap 318, and the MTJ cap 318 couples to bottom electrode 310.

In another alternative configuration, the MTJ 316 can be a perpendicular MTJ in which the MTJ film stack (not shown) can be a fixed layer 324 coupled to a bottom electrode 310, a free layer 322 coupled to an MTJ cap 318, and a tunnel barrier layer 326 coupled between the free layer 322 and fixed layer 324.

Figure 3A:
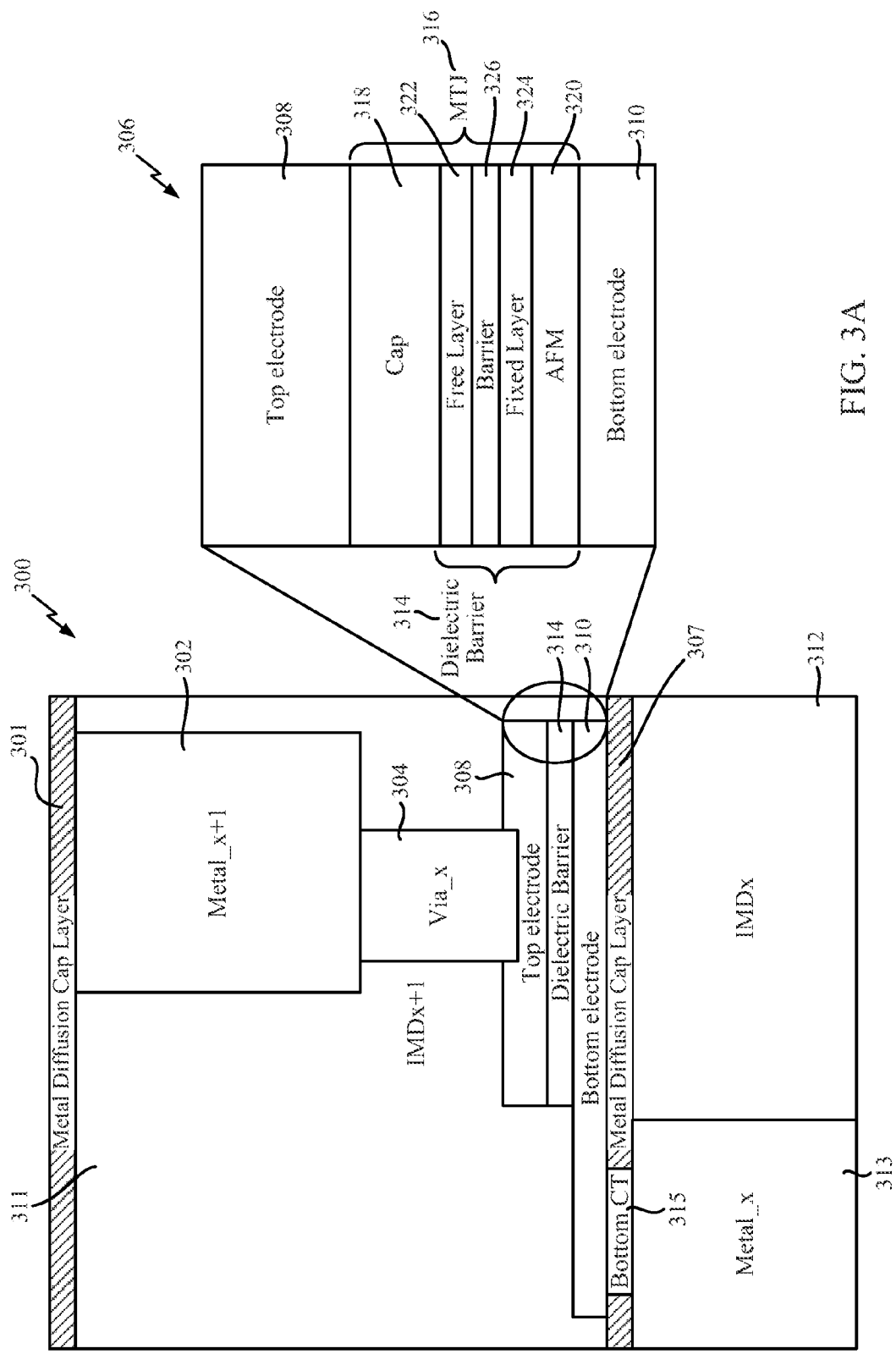
FIGS. 3A-3C are cross sectional diagrams of a one time/multiple time programmable (OTP/MTP) structure according to aspects of the present disclosure.

According to the aspect of the disclosure shown in FIG. 3A, the OTP structure 306 is fabricated using three masks in a BEOL process, in which a first mask forms the top electrode 308 and dielectric barrier 314, a second mask forms the bottom electrode 310, and a third mask forms the bottom contact 315. The OTP structure 306 has high resistance in a pre-programmed state and low resistance in a programmed state after the dielectric barrier 314 is broken down during programming. The program voltage depends on the thickness of the metal oxide barrier layer or dielectric film layer 326.

A back end of line (BEOL) structure 330 according to another aspect of the present disclosure is described with reference to FIG. 3B. The BEOL structure 330 includes a first conductive element 332 of a first conductive layer formed in a first inter-metal dielectric (IMD) layer 341, a first via 334 coupled to the first conductive element 332. A first metal diffusion cap layer 331 is formed on the first conductive element 332 and the first IMD layer 341. A one time programmable (OTP) structure 336 is coupled to the first via 334. According to one aspect of the present disclosure, the OTP structure 336 includes an MTJ cap 348 coupled to the first via 334 and a bottom electrode 340 formed on a second metal diffusion cap layer 337. The second metal diffusion cap layer 337 is formed on a second IMD layer 342 and a second conductive element 343 of a second conductive layer. A bottom contact 345 extends through the second metal diffusion cap layer 337 and is coupled between the bottom electrode 340 and the second conductive element 343.

A dielectric barrier 344 is coupled between the first via 334 and the bottom electrode 340. An MTJ 346 includes the MTJ cap 348 and an anti-ferromagnetic layer 350 coupled to the bottom electrode 340. A free layer 352 of an MTJ is coupled to the MTJ cap 348, and a fixed layer 354 of the MTJ is coupled to the AFM layer 350. A dielectric barrier layer 356 of the MTJ is coupled between the free layer 352 and the fixed layer 354. The dielectric barrier 344 of the BEOL structure 330 includes the free layer 352, the dielectric barrier layer 356, the fixed layer 354 and the AFM layer 350 of the MTJ 346.

Alternatively, according to this aspect of the disclosure the MTJ 346 can have reversed film stack (not shown) in which the anti-ferromagnetic film 350 is on top of the film stack to couple with the via 334. In this alternative configuration, the fixed layer 354 couples to the anti-ferromagnetic film 350 and the barrier 356, the barrier 356 couples to the free layer 352, and the free layer 352 couples to the MTJ cap 348. The MTJ cap 348 couples to bottom electrode 340.

In another alternative configuration, the MTJ 346 can be a perpendicular MTJ in which the MTJ film stack (not shown) can be a fixed layer 354 coupled to the bottom electrode 340, a free layer 352 coupled to the MTJ cap 348, and a tunnel barrier layer 356 coupled between the free layer 352 and the fixed layer 354.

According to this aspect of the present disclosure, the OTP structure 336 is fabricated using three masks in a BEOL process, in which a first mask is used to form the top electrode 368 and dielectric barrier 344, a second mask is used to form the bottom electrode 340, and a third mask is used to form the bottom contact 345. The OTP structure 336 has high resistance in a pre-programmed state and low resistance in a programmed state after the dielectric barrier 344 is broken down during programming. The program voltage depends on the thickness of the metal oxide barrier layer or dielectric film layer 356.

A back end of line (BEOL) structure 360 according to still another aspect of the present disclosure is described with reference to FIG. 3C. The BEOL structure 360 includes a first conductive element 362 of a first conductive layer formed in a first inter-metal dielectric (IMD) layer 371, and a first via 364 coupled to the first conductive element 362. A first metal diffusion cap layer 361 is formed on the first conductive element 362 and the first IMD layer 371. A one time programmable (OTP) structure 366 is coupled to the first via 364. According to one aspect of the present disclosure, the OTP structure 366 includes a top electrode 368 coupled to the first via 364 and a bottom electrode 370 formed on a second metal diffusion cap layer 367. The second metal diffusion cap layer 367 is formed on a second IMD layer 372 and a second conductive element 373 of a second conductive layer. A bottom contact 375 extends through the second metal diffusion cap layer 367 and is coupled between the bottom electrode 370 and the second conductive element 373.

The dielectric barrier layer 374 can be a MTJ metal oxide barrier or other dielectric film barrier, for example. According to this aspect of the present disclosure, the OTP structure 366 is fabricated using three masks in a BEOL process, in which a first mask is used to form the top electrode 368 and dielectric barrier 374, a second mask is used to form the bottom electrode 370, and a third mask is used to form the bottom contact 375. The OTP structure 366 has resistance in a high pre-programmed state and low resistance in a programmed state after the dielectric barrier 344 is broken down during programming. The program voltage depends on the thickness of the metal oxide barrier layer or dielectric film layer 374. According to this aspect of the present disclosure, the OTP structure 366 can be a metal-insulator-metal (MIM) capacitor structure, for example.

A back end of line (BEOL) structure 400 according to another aspect of the present disclosure is described with reference to FIG. 4A. The BEOL structure 400 includes a first conductive element 402 of a first conductive layer formed in a first inter-metal dielectric (IMD) layer 411 and a first via 404 coupled to the first conductive element 402. A first metal diffusion cap layer 401 is formed on the first conductive element 402 and the first IMD layer 411. A one time programmable (OTP) structure 406 is coupled to the first via 404. According to one aspect of the present disclosure, the OTP structure 406 includes a top electrode 408 coupled the first via 404 and a bottom electrode 410 formed on a second metal diffusion cap layer 407. The second metal diffusion cap layer 407 is formed on a second IMD layer 412 and a second conductive element 413 of a second conductive layer. A bottom contact 415 extends through the second metal diffusion cap layer 407 and is coupled between the bottom electrode 410 and the second conductive element 413. The second conductive element 413 and the bottom contact are formed directly under the OTP structure 406.

A dielectric barrier 414 is coupled between the top electrode 408 and the bottom electrode 410. According to the aspect of the disclosure shown in FIG. 4A, the dielectric barrier 414 of the BEOL structure 400 is a magnetic tunnel junction (MTJ) 416. The MTJ 416 includes a MTJ cap 418 coupled to the top electrode 408 and an anti-ferromagnetic layer 420 coupled to the bottom electrode 410. A free layer 422 of the MTJ 416 is coupled to the MTJ cap 418, and a fixed layer 424 of the MTJ 416 is coupled to the AFM layer 420. A dielectric film layer 426 of the MTJ 416 is coupled between the free layer 422 and the fixed layer 424.

Alternatively, according to this aspect of the disclosure the MTJ 416 can have a reversed film stack (not shown) in which the anti-ferromagnetic film 420 is on top of the film stack to couple with the top electrode 408. In this alternative configuration, the fixed layer 424 couples to the anti-ferromagnetic film 420 and the barrier 426, the barrier 426 couples to the free layer 422, and the free layer 422 couples to the MTJ cap 418. The MTJ cap 418 couples to the bottom electrode 410.

In another alternative configuration, the MTJ 416 can be a perpendicular MTJ in which the MTJ film stack (not shown) can be a fixed layer 424 coupled to a bottom electrode 410, a free layer 422 coupled to an MTJ cap 418, and a tunnel barrier layer 426 coupled between the free layer 422 and the fixed layer 424.

Figure 4A:
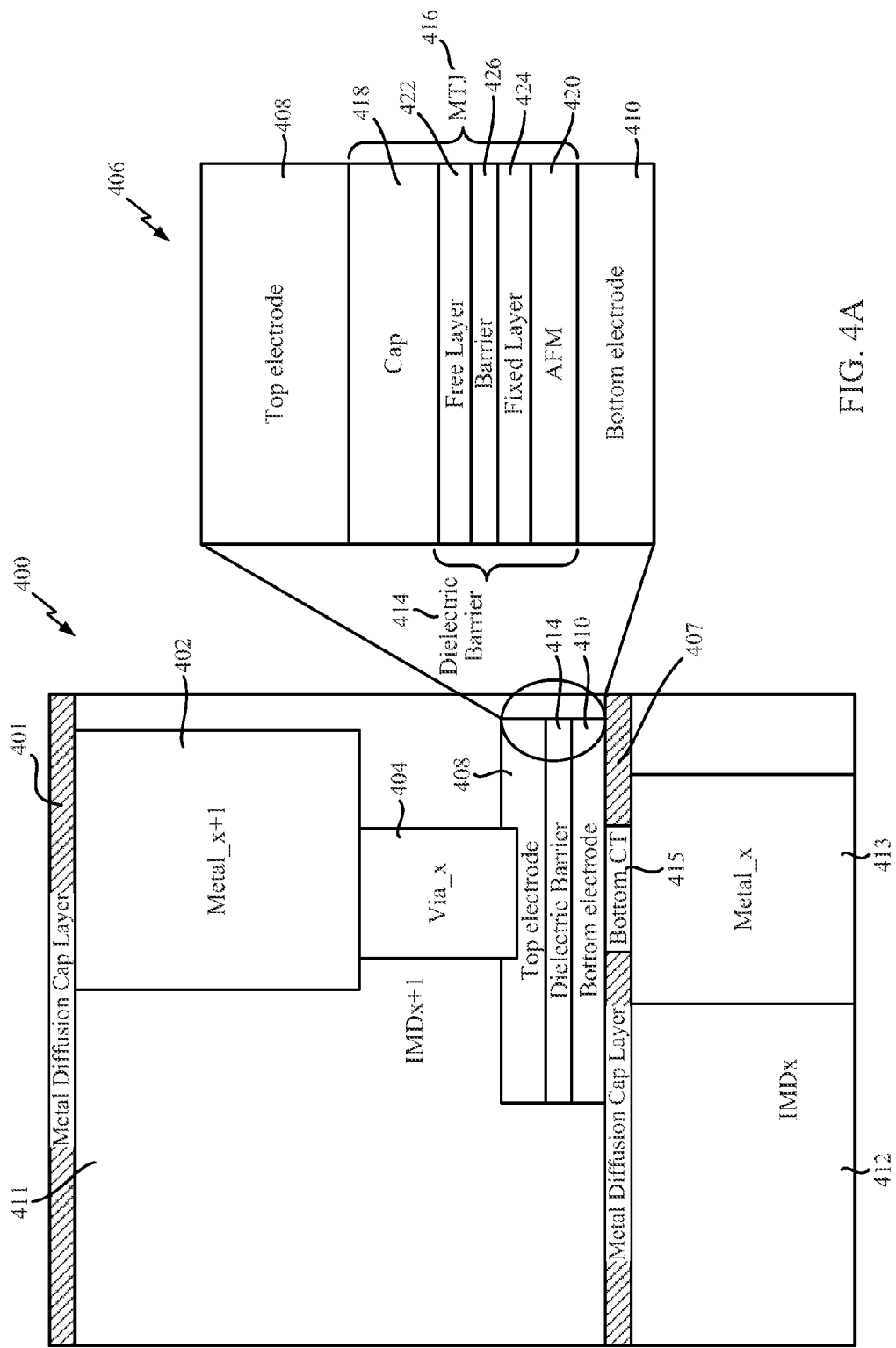
FIGS. 4A-4C are cross-sectional diagrams of a one time programmable (OTP) structure according to aspects of the present disclosure.

According to the aspect of the disclosure shown in FIG. 4A, the OTP structure 406 is fabricated using two masks in a BEOL process, in which a first mask is used to form the OTP structure 406 and a second mask is used to form the bottom contact 415. The OTP structure 406 has high resistance in a pre-programmed state and low resistance in a programmed state after the dielectric barrier 414 is broken down during programming. The program voltage depends on the thickness of the dielectric film layer 426.

Figure 4B:
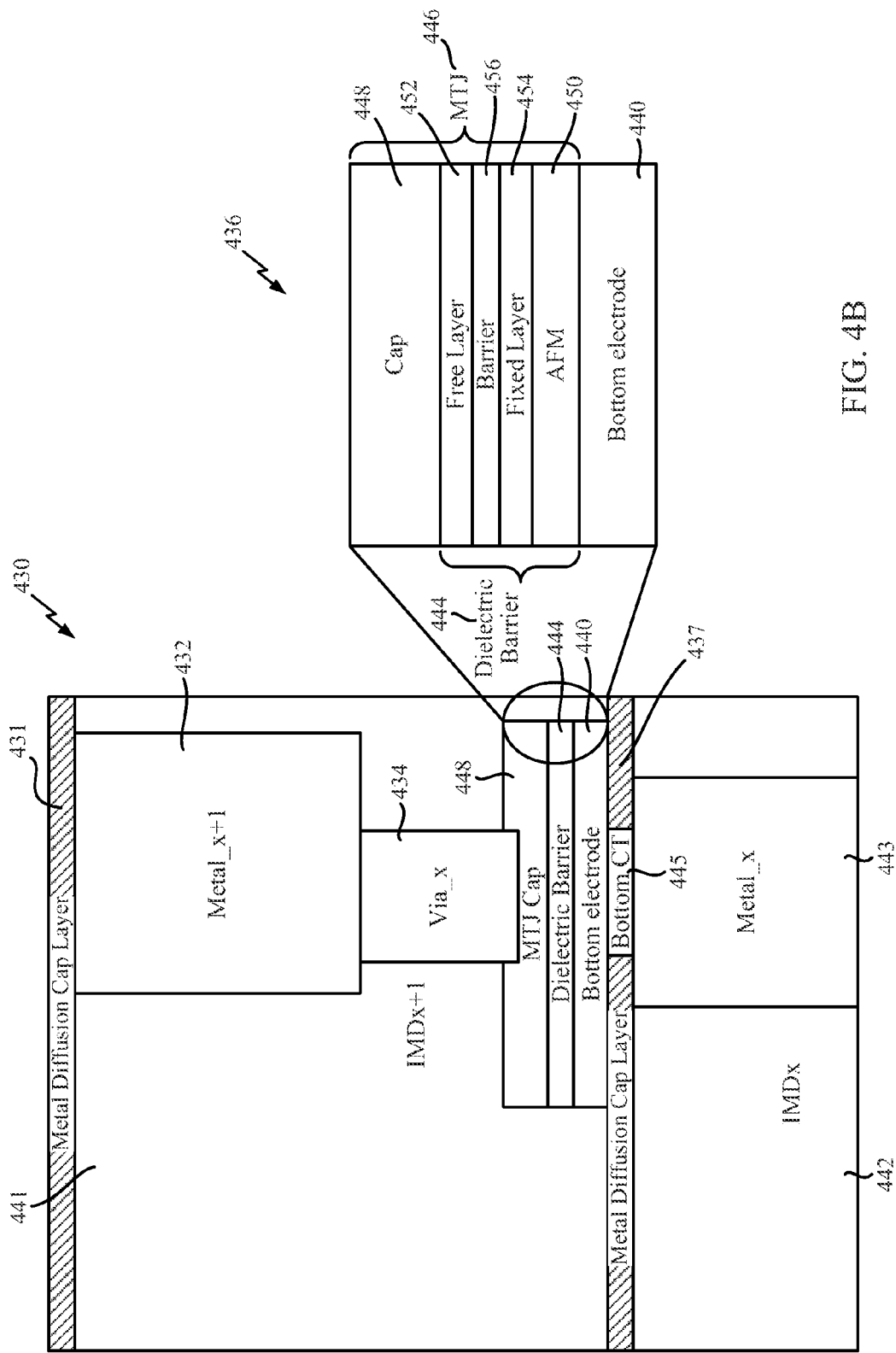

A back end of line (BEOL) structure 430, according to another aspect of the present disclosure, is described, with reference to FIG. 4B. The BEOL structure 430 includes a first conductive element 432 of a first conductive layer formed in a first inter-metal dielectric (IMD) layer 441, and a first via 434 coupled to the first conductive element 432. A first metal diffusion cap layer 431 is formed on the first conductive element 432 and the first IMD layer 441. A one time programmable (OTP) structure 436 is coupled to the first via 434. According to one aspect of the present disclosure, the OTP structure 436 includes an MTJ cap 448 coupled to the first via 434 and a bottom electrode 440 formed on a second metal diffusion cap layer 437. The second metal diffusion cap layer 437 is formed on a second IMD layer 442 and a second conductive element 443 of a second conductive layer. A bottom contact 445 extends through the second metal diffusion cap layer 437 and is coupled between the bottom electrode 440 and the second conductive element 443. The second conductive element 443 and the bottom contact are thrilled directly under the OTP structure 436.

A dielectric barrier 444 is coupled between first via 434 and the bottom electrode 440. An MTJ 446 includes the MTJ cap 448 and an anti-ferromagnetic layer 450 coupled to the bottom electrode 440. A free layer 452 of an MTJ 446 is coupled to the MTJ cap 448, and a fixed layer 454 of the 446 is coupled to the AFM layer 450. A dielectric film layer 456 of the MTJ is coupled between the free layer 452 and the fixed layer 454. The dielectric barrier 444 of the BEOL structure 430 includes the free layer 452, the dielectric film layer 456, the fixed layer 454 and the AFM layer 450 of the MTJ 446.

Alternatively, according to this aspect of the disclosure the MTJ 446 can have a reversed film stack (not shown) in which the anti-ferromagnetic film 450 is on top of the film stack to couple with the via 434. In this alternative configuration, the fixed layer 454 couples to the anti-ferromagnetic film 450 and the barrier 456. The barrier 456 couples to the free layer 452, and the free layer 452 couples to the MTJ cap 448. The MTJ cap 448 couples to the bottom electrode 440.

In another alternative configuration, the MTJ 446 can be a perpendicular MTJ in which the MTJ film stack (not shown) can be a fixed layer 454 coupled to a bottom electrode 440, a free layer 452 coupled to an MTJ cap 448, and a tunnel barrier layer 456 coupled between the free layer 452 and the fixed layer 454.

According to this aspect of the present disclosure, the OTP structure 436 is fabricated using two masks in a BEOL process, in which a first mask is used to form the OTP structure 436 and a second mask is used to form the bottom contact 445. The OTP structure 436 has high resistance in a pre-programmed state and low resistance in a programmed state after the dielectric barrier 444 is broken down during programming. The program voltage depends on the thickness of the dielectric film layer 456.

Figure 4C:
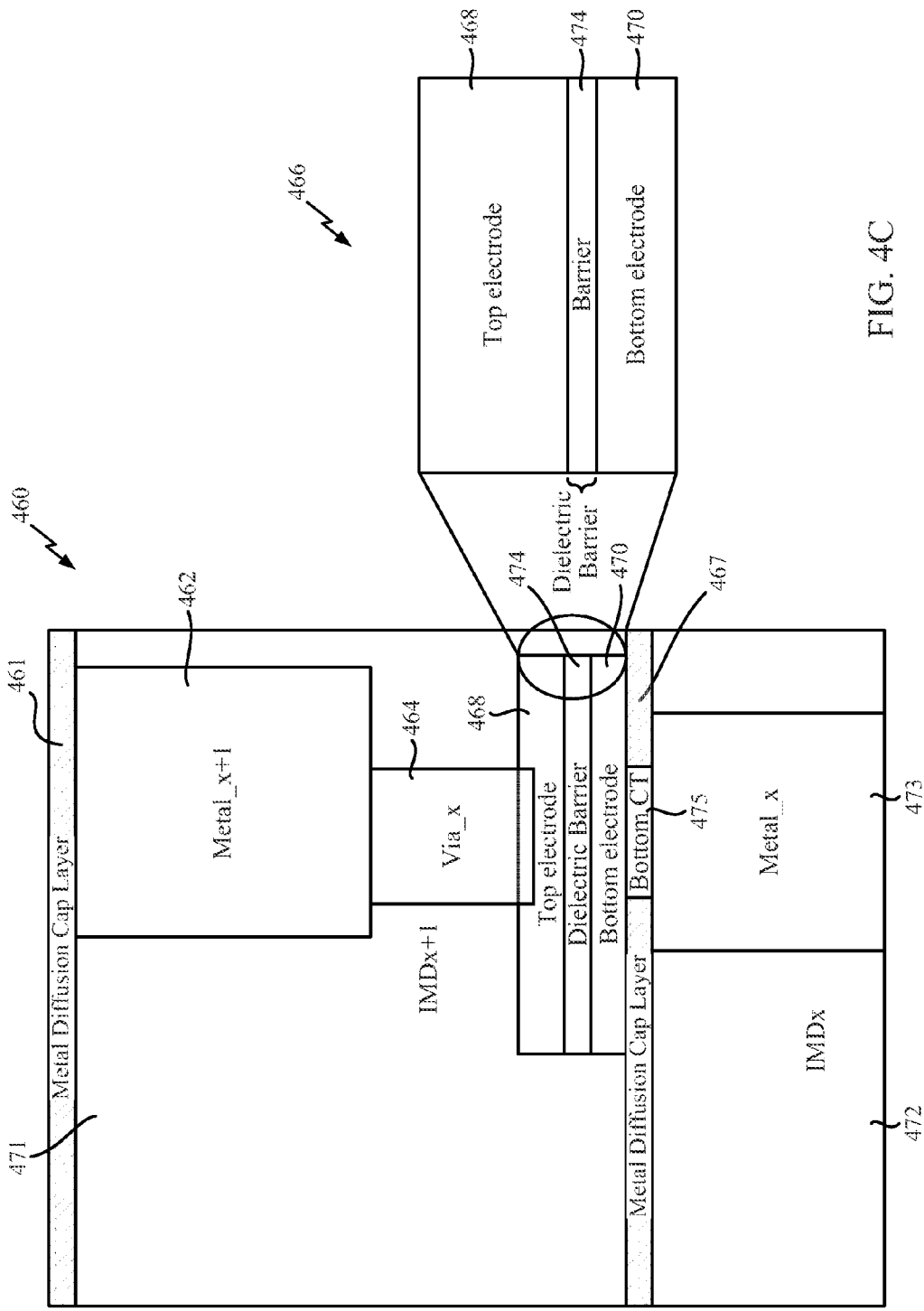

A back end of line (BEOL) structure 460 according to yet another aspect of the present disclosure is described with reference to FIG. 4C. The BEOL structure 460 includes a first conductive element 462 of a first conductive layer formed in a first inter-metal dielectric (IMD) layer 471, a first via 464 coupled to the first conductive element 462. A first metal diffusion cap layer 461 is formed on the first conductive element 462 and the first IMD layer 471. A one time programmable (OTP) structure 466 is coupled to the first via 464. According to one aspect of the present disclosure, the OTP structure 466 includes a top electrode 468 coupled the first via 464 and a bottom electrode 470 formed on a second metal diffusion cap layer 467. The second metal diffusion cap layer 467 is formed on a second IMD layer 472 and a second conductive element 473 of a second conductive layer. A bottom contact 475 extends through the second metal diffusion cap layer 467 and is coupled between the bottom electrode 470 and the second conductive element 473. The second conductive element 473 and the bottom contact are formed directly under the OTP structure 466.

The dielectric barrier layer 474 can be an MTJ metal oxide barrier or other dielectric film barrier, for example. According to this aspect of the present disclosure, the OTP structure 466 is fabricated using two masks in a BEOL process, in which a first mask is used to form the OTP structure 466 and a second mask is used to form the bottom contact 475. The OTP structure 466 has high resistance in a pre-programmed state and low resistance in a programmed state after the dielectric barrier 474 is broken down during programming. The program voltage depends on the thickness of the barrier layer 474. According to this aspect of the present disclosure, the OTP structure 466 can be a metal-insulator-metal (MIM) capacitor structure, for example.

Figure 5A:
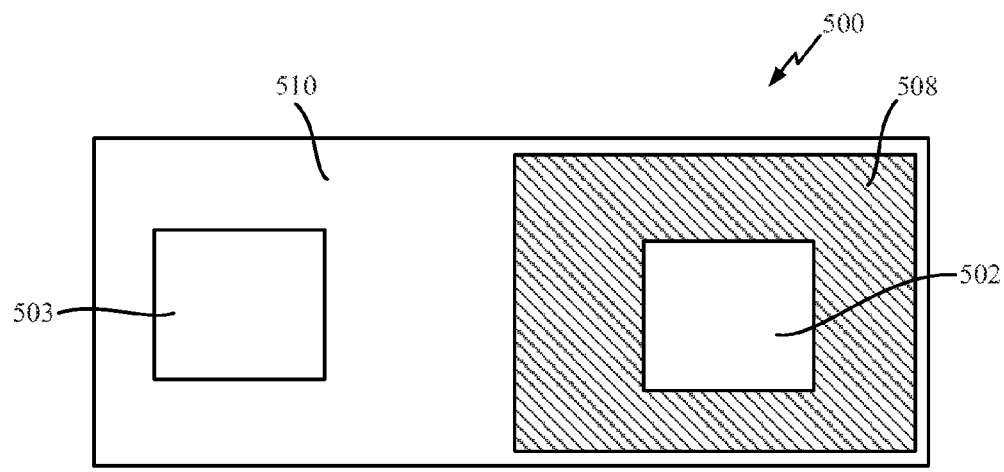
FIGS. 5A-5B are top view layout diagrams of one time programmable (OTP) structures according to aspects of the present disclosure.

Another aspect of the present disclosure includes a one time/multiple time programmable (OTP/MTP) BEOL structure in which a fuse is constructed with a tunable program voltage by adjusting the bottom electrode shape. The OTP/MTP BEOL structures shown in FIGS. 2A-2C and FIGS. 3A-3C, which are described previously, can be constructed in a one time programmable configuration or in a multiple time programmable configuration. FIG. 5A is a top view diagram of a BEOL structure 500 such as one of the BEOL structures shown in FIGS. 2A-2C and FIGS. 3A-3C in which the BEOL structure 500 is constructed as a one time programmable structure. The BEOL structure 500 includes a first conductive element (Via) 502 coupled to a top electrode 508 and a second conductive element (Via) 503 coupled to a bottom electrode 510. The bottom electrode 510 has a extended shape so that the first conductive element 502 is laterally displaced from the second conductive element 503.

Figure 2B:
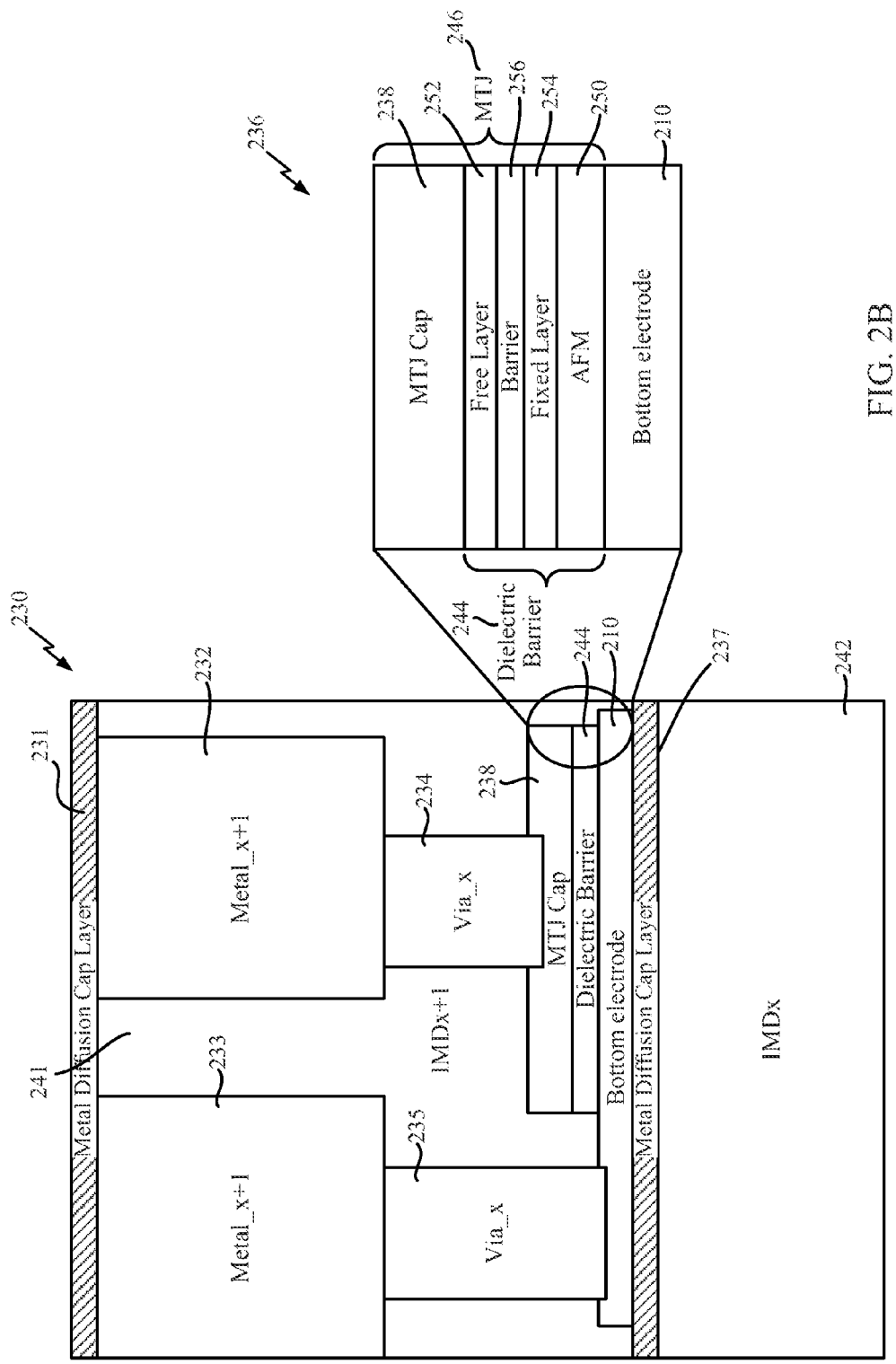
Figure 2C:
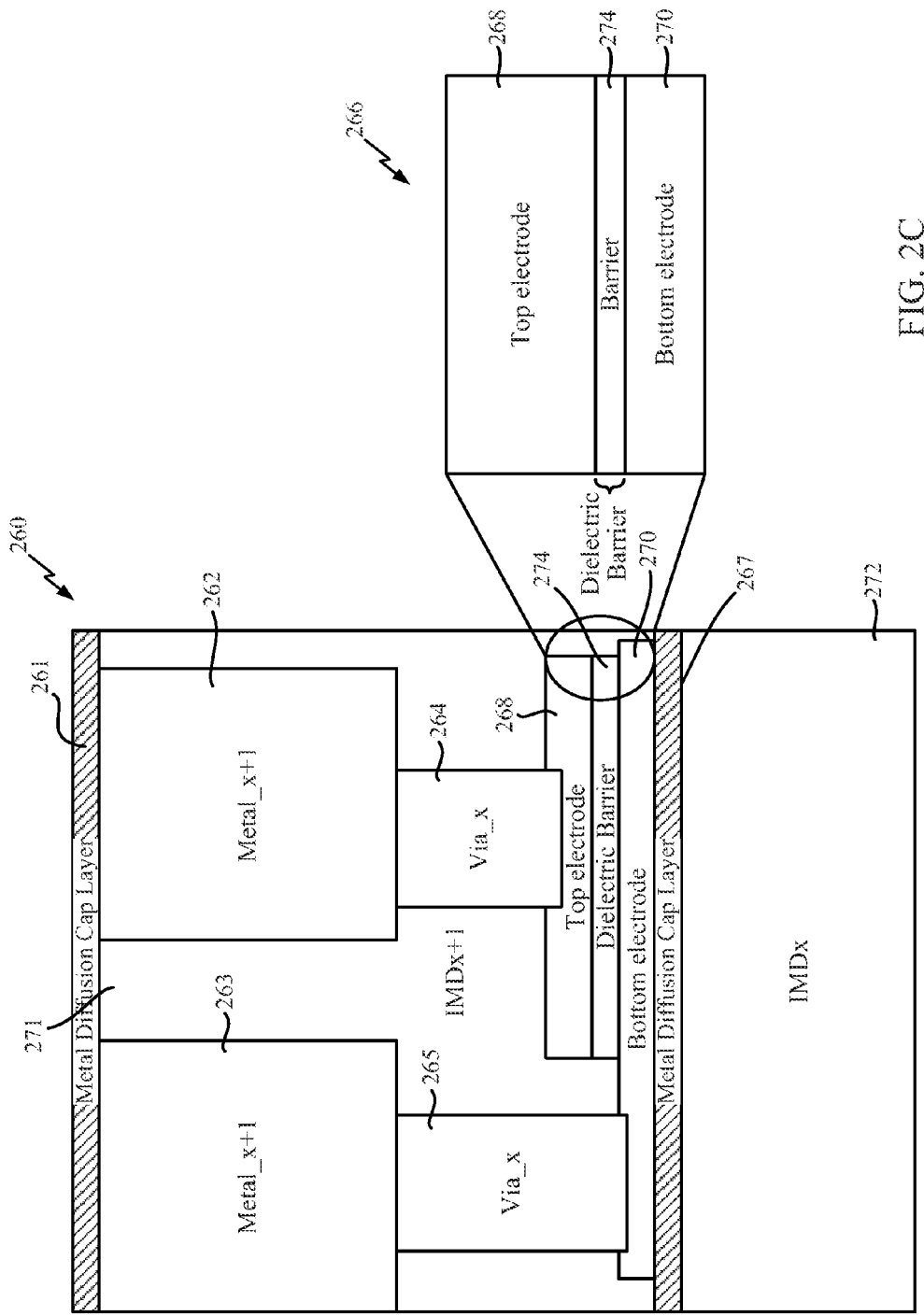
Figure 3B:
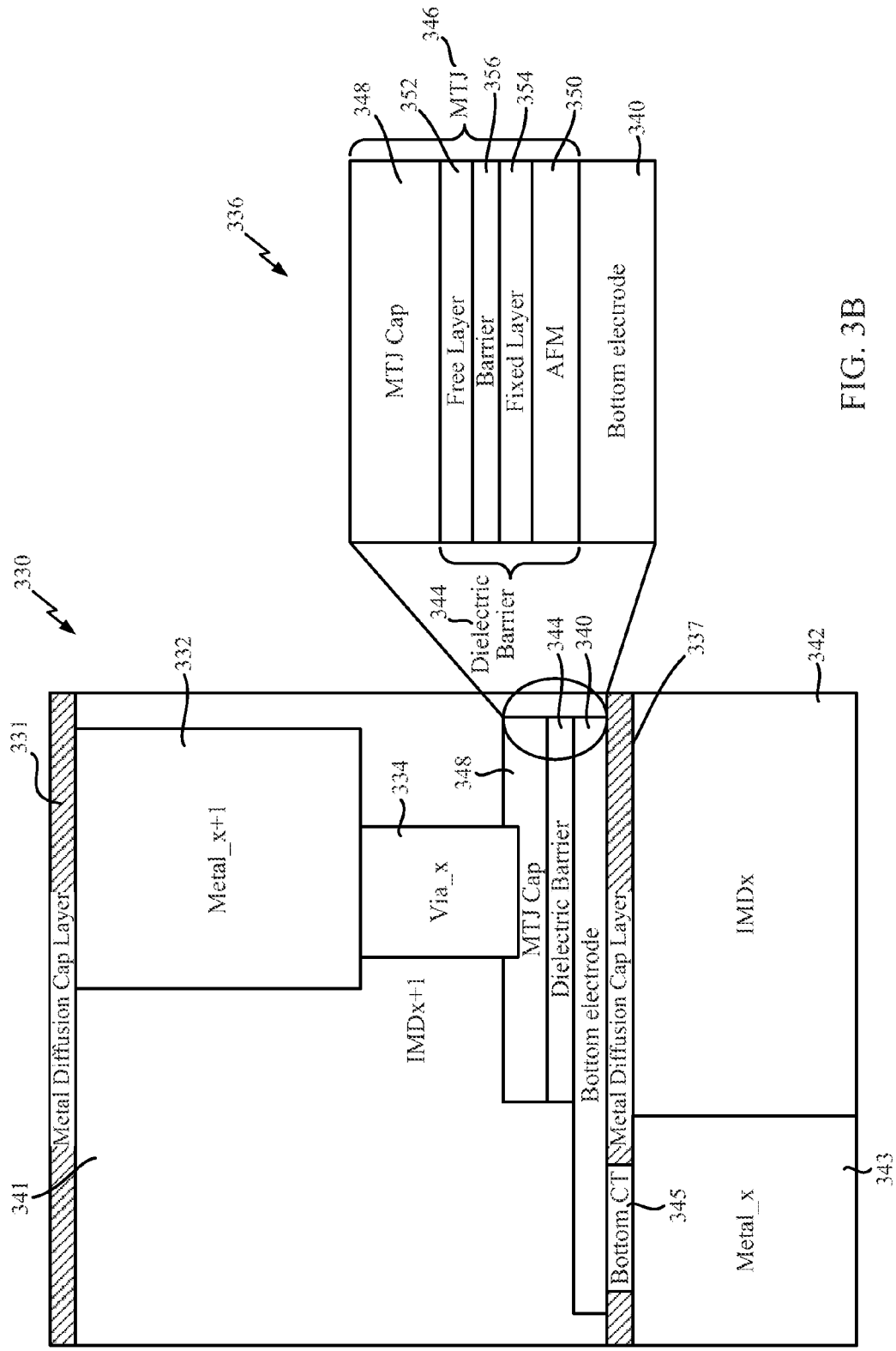
Figure 3C:
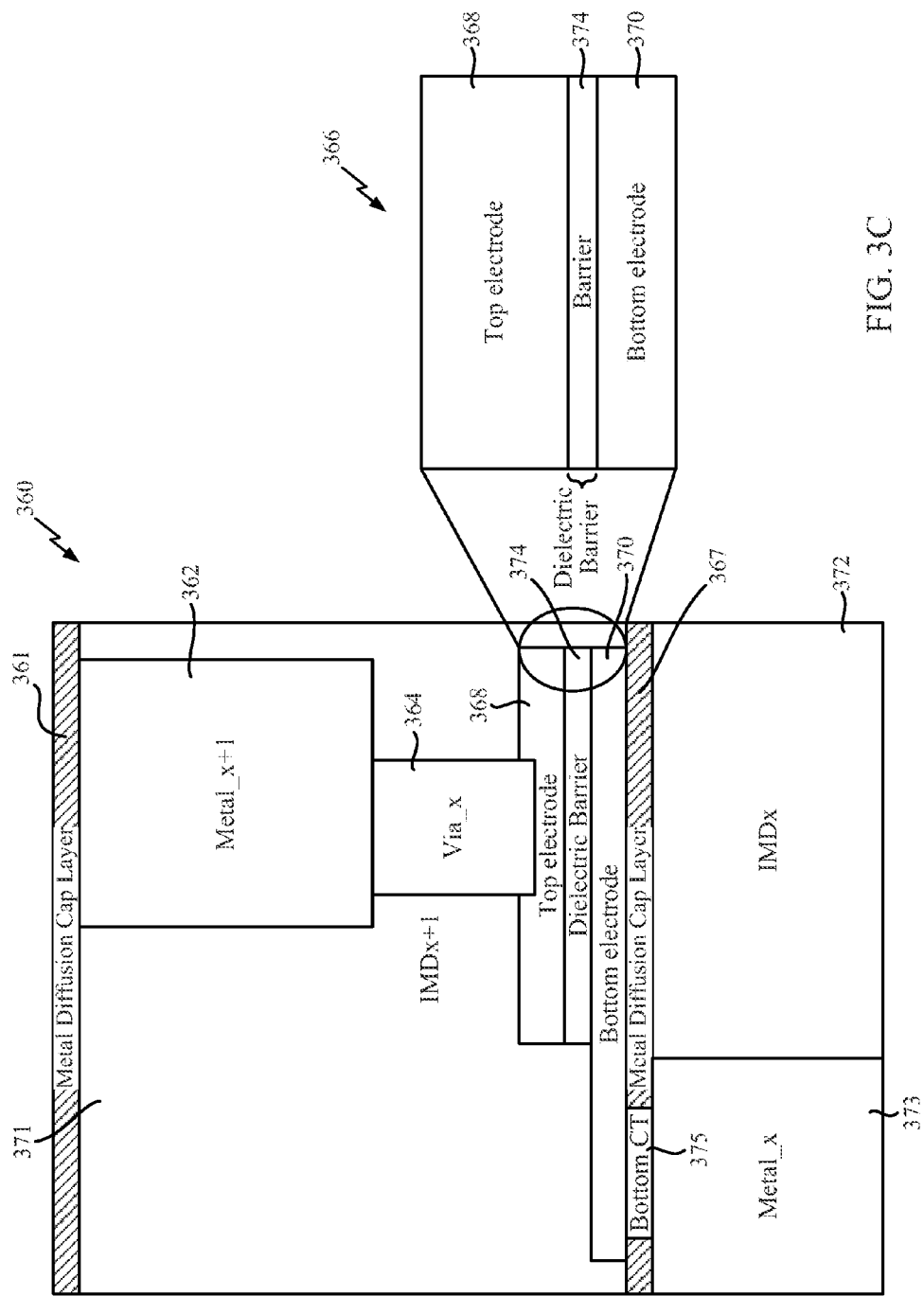
Figure 5B:
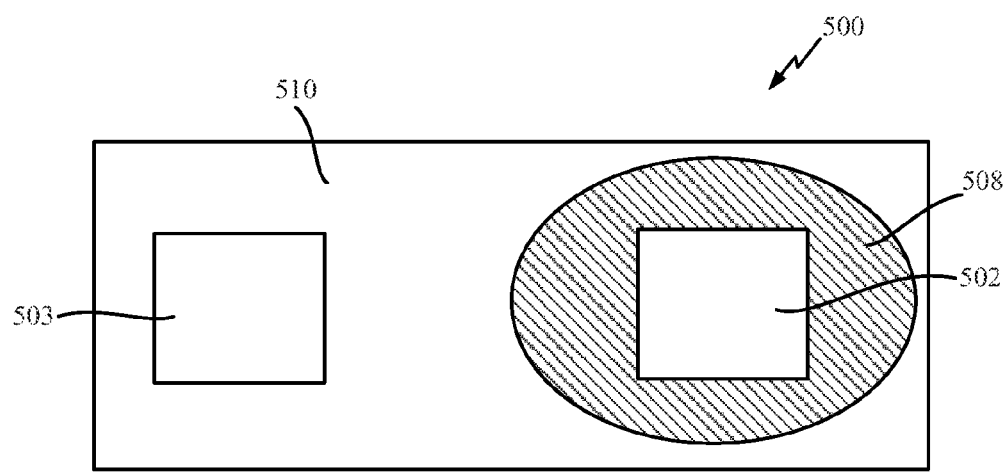

Although the second conductive element 503 is shown as being on top of the bottom electrode 510 in the top view, which corresponds to the configuration shown in FIGS. 2A-2C, for example, it should be understood that the second conductive element 503 can alternatively be coupled to the bottom of the bottom electrode 510, which corresponds to the configuration shown in FIGS. 3A-3C, for example. A dielectric barrier (not shown in FIG. 5A) is coupled between the top electrode 508 and the bottom electrode 510. The top electrode 508 and/or the dielectric barrier is shown with a rectangular shape in FIG. 5A but may alternatively may have an oval or circular shape as shown in FIG. 5B.

Figure 5C:
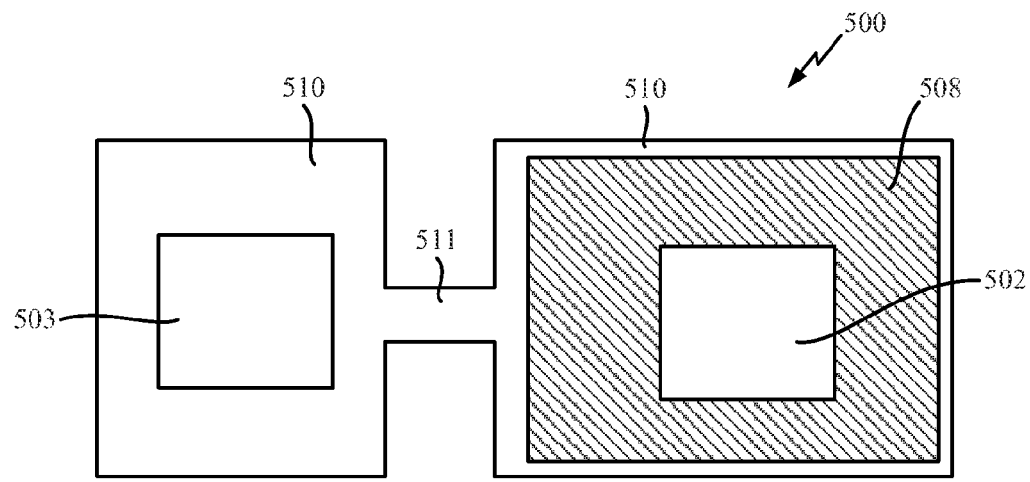
FIGS. 5C-5D are top view layout diagrams of one time/multiple time programmable (OTP/MTP) structures according to aspects of the present disclosure.

FIG. 5C is a top view diagram of a BEOL structure 500 such as one of the BEOL structures shown in FIGS. 2A-2C and FIGS. 3A-3C in which the BEOL structure 500 is constructed as a multiple time programmable structure. The BEOL structure 500 includes a first conductive element (Via) 502 coupled to a top electrode 508 and a second conductive element (Via) 503 coupled to a bottom electrode 510. The bottom electrode 510 has a extended shape so that the first conductive element 502 is laterally displaced from the second conductive element 503, although the second conductive element 503 is shown as being on top of the bottom electrode 510 in the top view, which corresponds to the configuration shown in FIGS. 2A-2C, for example, it should be understood that the second conductive element 503 can alternatively be coupled to the bottom of the bottom electrode 510, which corresponds to the configuration shown in FIGS. 3A-3C, for example.

Figure 5D:
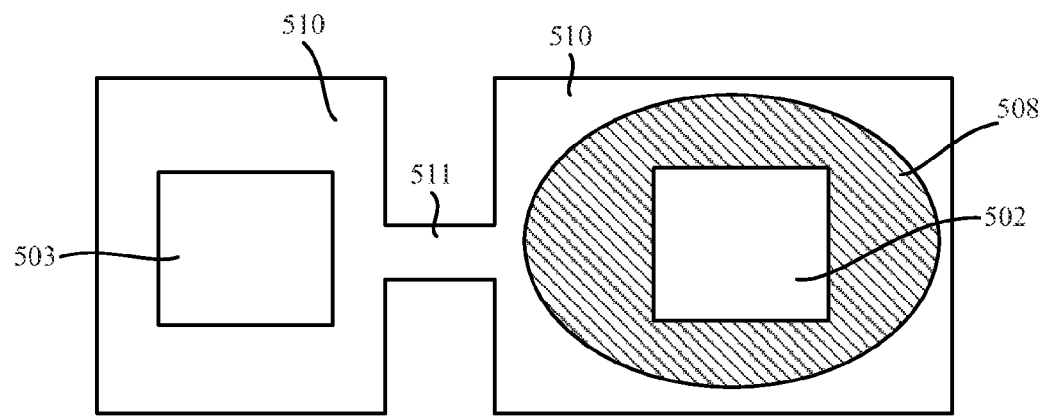

A dielectric barrier (not shown in FIG. 5C) is coupled between the top electrode 508 and the bottom electrode 510. In this aspect, the bottom electrode 510 includes a narrow fuse portion 511. The top electrode 508 and/or the dielectric barrier is shown with a rectangular shape in FIG. 5C but may alternatively have an oval or circular shape as shown in FIG. 5D. Application of a programming voltage between the first conductive element 502 and the second conductive element 503 causes the fuse portion 511 to open-circuit resulting in the very high resistance state of the multiple time programmable BEOL structure 500.

Figure 6:
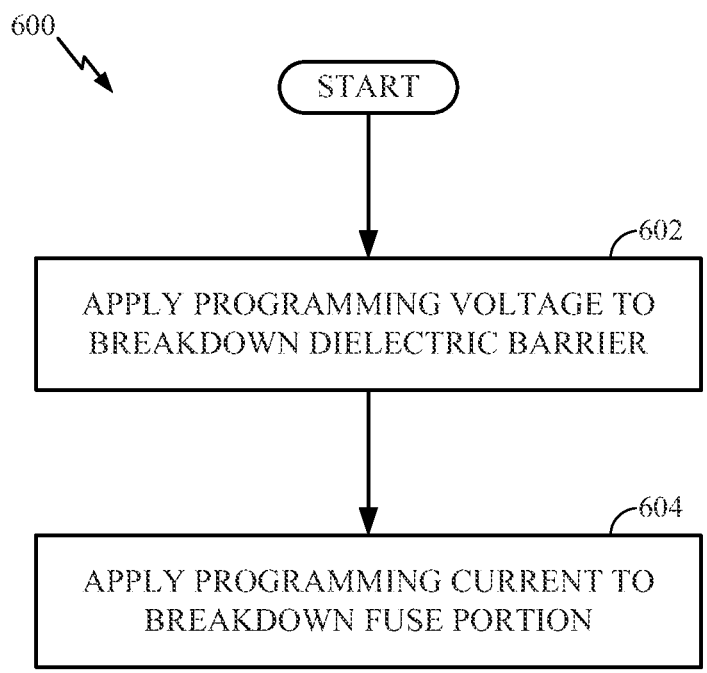
FIG. 6 is process flow diagram illustrating a method of programming a one time/multiple time programmable (OTP/MTP) structure according to aspects of the present disclosure.

The program voltage, which is a sufficient voltage to break down the barrier layer of a one time programmable BEOL structure or a multiple time programmable BEOL structure, can be from about 0.5V to 10V, for example, depending on the barrier layer thickness. The programming current, which is sufficient to open-circuit the fuse portion of a multiple time programmable BEOL structure can range from about 10 mA to about 50 mA, for example, depending on the bottom electrode shape and thickness. FIG. 6 is a process flow diagram illustrating a method of programming a one time programmable (OTP) or multiple time programmable (MTP) back end of line (BEOL) structure according to an aspect of the present disclosure. The method includes applying a predetermined voltage to a dielectric barrier layer of the BEOL structure in block 602. The predetermined voltage is sufficient to break down the dielectric barrier layer. According to an aspect of the present disclosure, the method also includes applying a predetermined current through the dielectric barrier layer subsequent to the application of the predetermined voltage. The predetermined current is sufficient to break down a fuse portion of the OTP/MTP BEOL structure.

An apparatus for programming a one time programmable (OTP) or multiple time programmable (MTP) back end of line (BEOL) structure according to another aspect of the disclosure includes means for applying a predetermined voltage to a dielectric barrier layer of the BEOL structure in which the predetermined voltage is sufficient to break down the dielectric barrier layer. According to this aspect of the disclosure, the apparatus also includes means for applying the predetermined voltage to a magnetic tunnel junction (MTJ) structure including the dielectric barrier layer or to a metal-insulator-metal (MIM) capacitor structure including the dielectric barrier layer. The apparatus may also include means for applying a predetermined current through the dielectric barrier layer subsequent to applying the predetermined voltage. According to this aspect, the predetermined current is sufficient to break down a fuse portion of the OTP or MTP BEOL structure. The means for applying a predetermined voltage to the dielectric barrier layer and the means for applying the predetermined current through the dielectric barrier layer current may include programming circuitry coupled to the conductive portions of the BEOL structure such as the first conductive element 102 of a first conductive layer formed in a first inter-metal dielectric (IMD) layer 111, the first via 104 coupled to the first conductive element 102, the top electrode 108 coupled to the first via 104 and the bottom electrode 110 coupled to a second conductive layer 112 as shown in FIG. 1A, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
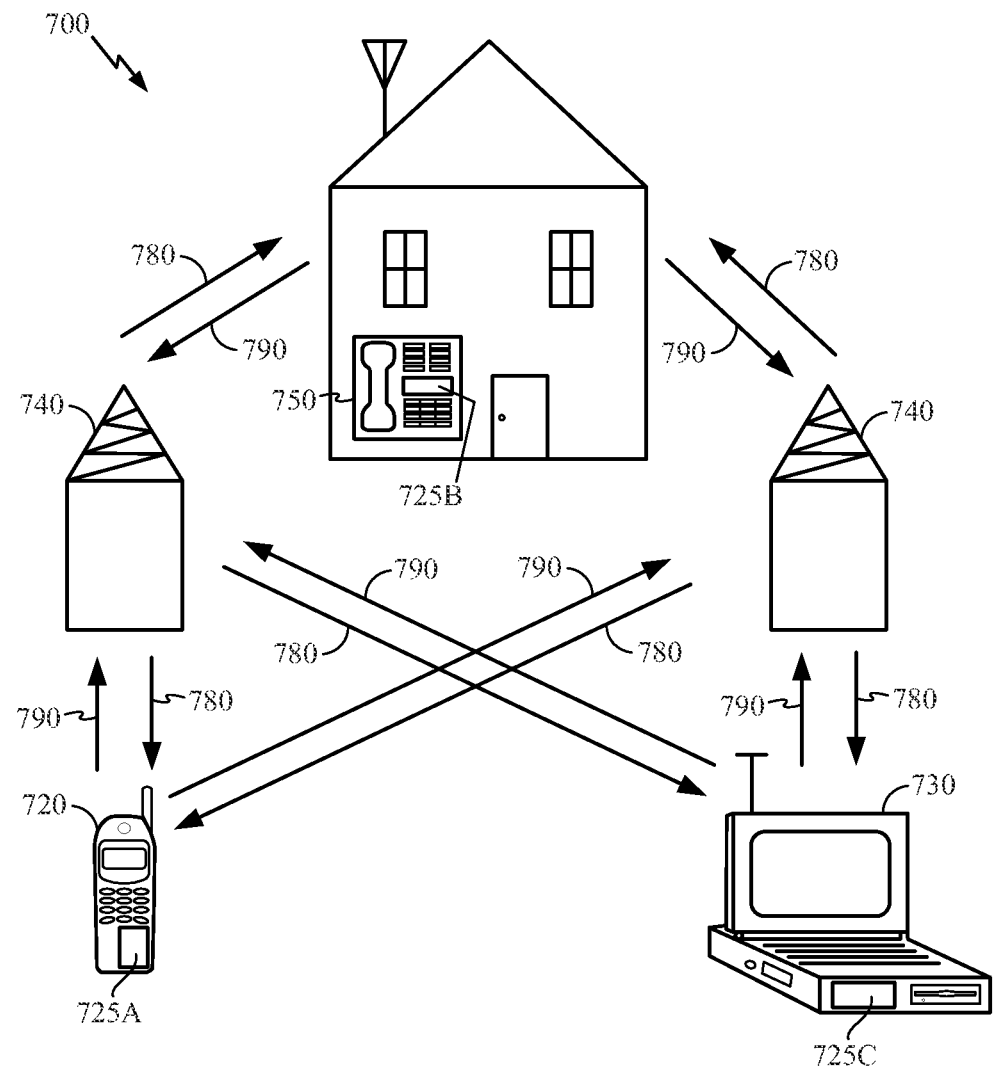
FIG. 7 is a block diagram showing an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC structures 725A, 725C and 725B that include the disclosed OTP/MTP BEOL structure. It will be recognized that other structures may also include the disclosed OTP/MTP BEOL structure, such as the base stations, switching structures, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled structures, navigation structures, set top boxes, music players, video players, entertainment units, fixed location data units such as meter reading equipment, or other structures that store or retrieve data or computer instructions, or combinations thereof. Although FIG. 7 illustrates remote units according to the teachings of the disclosure, the disclosure is not limited to these exemplary illustrated units. Aspects of the disclosure may be suitably employed in many structures which include the disclosed OTP/MTP BEOL structure.

Figure 8:
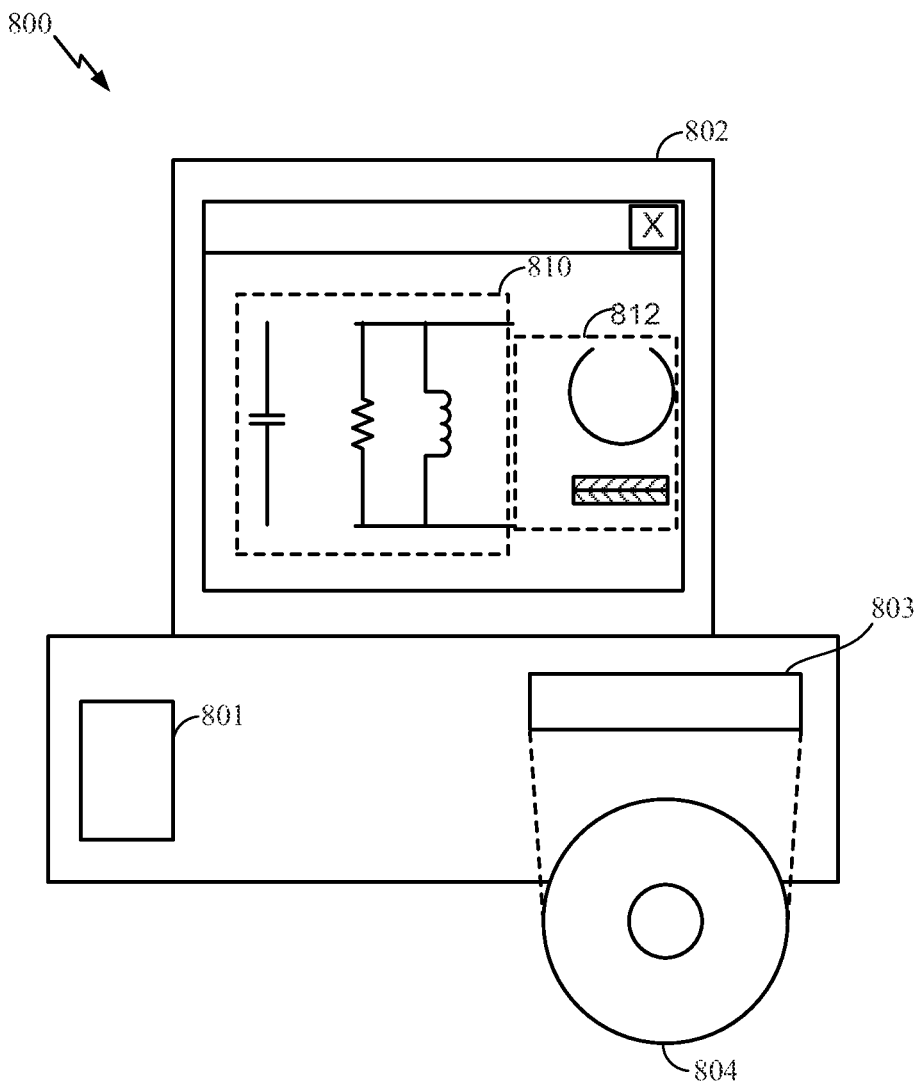
FIG. 8 is a block diagram illustrating a design workstation used for circuit, layout, and logic design of a one time/multiple time programmable (OTP/MTP) structure according to one aspect of the present disclosure.

FIG. 8 is a block diagram illustrating a design workstation used for circuit, layout, and logic design of a semiconductor component, such as the OTP/MTP BEOL structure disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as the disclosed OTP/MTP BEOL structure. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate structure. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage structures, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic structure. Of course, if the substrate or electronic structure is inverted, above becomes below, and vice versa. Additionally, if oriented sideways, above and below may refer to sides of a substrate or electronic structure. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A back end of line (BEOL) structure, comprising:
a first conductive element of a first conductive layer;
a first via coupled to the first conductive element;
a two-time programmable BEOL structure coupled to the first via, the two-time programmable BEOL structure including a dielectric barrier and a bottom electrode; and
a magnetic tunnel junction (MTJ) cap layer coupled between the first via and the dielectric barrier and/or a top electrode coupled between the first via and the dielectric barrier.

2. The structure of claim 1, in which the dielectric barrier comprises:
a free layer coupled to the (MTJ) cap layer or coupled to the top electrode;
a barrier layer coupled to the free layer;
a fixed layer coupled to the barrier layer; and
an anti-ferromagnetic (AFM) layer coupled between the bottom electrode and the fixed layer.

3. The structure of claim 1, further comprising a second via coupled between the bottom electrode and a second conductive element of the first conductive layer.

4. The structure of claim 1, further comprising:
a bottom contact coupled to the bottom electrode; and
a second conductive element of a second conductive layer coupled to the bottom contact.

5. The structure of claim 1, in which the two time programmable BEOL structure comprises a metal-insulator-metal capacitor structure.

6. A back end of line (BEOL) structure, comprising:
a first conductive element of a first conductive layer;
a first via coupled to the first conductive element; and
a programmable structure coupled to the first via, the programmable structure including a dielectric barrier and a bottom electrode, in which the bottom electrode comprises a fuse portion between the first via and a second conductive element coupled to the bottom electrode and laterally displaced from the first via, the fuse portion configured to break down in response to a predetermined current.

7. The structure of claim 1, incorporated into a device selected from a group consisting of a music player, a video player, an entertainment unit, a navigation device, a communications device, a personal digital assistant (PDA), a fixed location data unit, and a computer.

8. A method of programming a two-time programmable back end of line (BEOL) structure, comprising:
applying a predetermined voltage to a dielectric barrier layer of the two-time programmable BEOL structure, the predetermined voltage being sufficient to break down the dielectric barrier layer; and
applying a predetermined current to the two-time programmable BEOL structure subsequent to applying the predetermined voltage, the predetermined current being sufficient to break down a fuse portion of a bottom electrode of the two-time programmable BEOL structure.

9. A method of programming a one time programmable (OTP) or multiple time programmable (MTP) back end of line (BEOL) structure, comprising:
applying a predetermined voltage to a dielectric barrier layer of the BEOL structure, the predetermined voltage being sufficient to break down the dielectric barrier layer; and
applying the predetermined voltage to a magnetic tunnel junction (MTJ) structure including the dielectric barrier layer or to a metal-insulator-metal (MIM) capacitor structure including the dielectric barrier layer.

10. A method of programming a one time programmable (OTP) or multiple time programmable (MTP) back end of line (BEOL) structure, comprising:
applying a predetermined voltage to a dielectric barrier layer of the BEOL structure, the predetermined voltage being sufficient to break down the dielectric barrier layer; and
applying a predetermined current through the dielectric barrier layer subsequent to applying the predetermined voltage, the predetermined current being sufficient to break down a fuse portion of a bottom electrode of the OTP or MTP BEOL structure.

11. The method of claim 8, further comprising incorporating the OTP or MTP structure into a music player, a video player, an entertainment unit, a navigation device, a communications device, a personal digital assistant (PDA), a fixed location data unit, and/or a computer.

12. An apparatus for programming a one time programmable (OTP) or multiple time programmable (MTP) back end of line (BEOL) structure, comprising:
means for applying a predetermined voltage to a dielectric barrier layer of the BEOL structure, the predetermined voltage being sufficient to break down the dielectric barrier layer; and
means for applying the predetermined voltage to a magnetic tunnel junction (MTJ) structure including the dielectric barrier layer or to a metal-insulator-metal (MIM) capacitor structure including the dielectric barrier layer.

13. The apparatus of claim 12, further comprising:
means for applying a predetermined current through the dielectric barrier layer subsequent to applying the predetermined voltage, the predetermined current being sufficient to break down a fuse portion of a bottom electrode of the OTP or MTP BEOL structure.

14. The apparatus of claim 12, incorporated into a music player, a video player, an entertainment unit, a navigation device, a communications device, a personal digital assistant (RDA), a fixed location data unit, and/or a computer.

15. A method of programming a one time programmable (OTP) or multiple time programmable (MTP) hack end of line (BEOL) structure, comprising steps for:
applying a predetermined voltage to a dielectric barrier layer of a magnetic tunnel junction (MTJ) structure in the BEOL structure or of a metal-insulator-metal (MIM)

capacitor structure in the BEOL structure, the predetermined voltage being sufficient to break down the dielectric barrier layer; and applying a predetermined current to the multi-time programmable BEOL structure subsequent to applying the predetermined voltage, the predetermined current being sufficient to break down a fuse portion of a bottom electrode of the multi-time programmable BEOL structure.

16. A method of programming a one time programmable (OTP) or multiple time programmable (MTP) back end of line (BEOL) structure, comprising steps for:

applying a predetermined voltage to a dielectric barrier layer of the BEOL structure, the predetermined voltage being sufficient to break down the dielectric barrier layer; and applying the predetermined voltage to a magnetic tunnel junction (MTJ) structure including the dielectric barrier layer or to a metal-insulator-metal (MIM) capacitor structure including the dielectric barrier layer.

17. The method of claim 15, further comprising a step of incorporating the OTP or MTP structure into a music player, a video player, an entertainment unit, a navigation device, a communications device, a personal digital assistant (PDA), a fixed location data unit, and/or a computer.

* * * * *